United States Patent
Hong et al.

(10) Patent No.: US 12,295,230 B2
(45) Date of Patent: May 6, 2025

(54) DISPLAY APPARATUS HAVING A LIGHT-EMITTING DEVICE AND A DRIVING CIRCUIT

(71) Applicant: LG Display Co., Ltd., Seoul (KR)

(72) Inventors: Gi Sang Hong, Seoul (KR); Young Wook Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 423 days.

(21) Appl. No.: 17/845,800

(22) Filed: Jun. 21, 2022

(65) Prior Publication Data

US 2023/0013464 A1 Jan. 19, 2023

(30) Foreign Application Priority Data

Jul. 13, 2021 (KR) .................. 10-2021-0091739

(51) Int. Cl.
*H10K 59/131* (2023.01)
*G09G 3/3233* (2016.01)
*H10K 59/12* (2023.01)
*H10K 59/121* (2023.01)
*H10K 71/00* (2023.01)

(52) U.S. Cl.
CPC ....... *H10K 59/1315* (2023.02); *G09G 3/3233* (2013.01); *G09G 2300/0426* (2013.01); *G09G 2300/0842* (2013.01); *H10K 59/1201* (2023.02); *H10K 59/1216* (2023.02); *H10K 71/00* (2023.02)

(58) Field of Classification Search
CPC ........... H10K 59/1315; H10K 59/1201; H10K 59/1216; H10K 71/00; H10K 71/166; H10K 59/1213; H10K 59/121; H10K 59/123; H10K 59/124; G09G 3/3233; G09G 2300/0426; G09G 2300/0842; H01L 27/1214

See application file for complete search history.

(56) References Cited

U.S. PATENT DOCUMENTS

| | | | |
|---|---|---|---|
| 12,041,819 B2 * | 7/2024 | Chen | H01L 27/124 |
| 2022/0310731 A1 * | 9/2022 | Chen | H01L 29/7869 |
| 2022/0384547 A1 * | 12/2022 | Lee | H10K 71/00 |
| 2023/0255077 A1 * | 8/2023 | Son | H10K 71/00 257/72 |
| 2024/0081099 A1 * | 3/2024 | Bae | H10K 59/126 |

(Continued)

*Primary Examiner* — J. E. Schoenholtz

(74) *Attorney, Agent, or Firm* — Fenwick & West LLP

(57) ABSTRACT

A display apparatus includes a light-emitting device and a driving circuit disposed in each pixel area. The driving circuit electrically connected to the light-emitting device may include a first thin film transistor, a second thin film transistor and a storage capacitor. A second semiconductor pattern of the second thin film transistor may be made of a material different from a first semiconductor pattern of the first thin film transistor. A separation insulating layer may be disposed between the first semiconductor pattern and the second semiconductor pattern. The storage capacitor may include a first capacitor electrode and a second capacitor electrode, which are sequentially stacked on the separation insulating layer. The first capacitor electrode may have a stacked structure of a first electrode layer including the same material as the second semiconductor pattern and a second electrode layer including a material having lower resistance than the first electrode layer.

26 Claims, 10 Drawing Sheets

(56) References Cited

U.S. PATENT DOCUMENTS

| | | | |
|---|---|---|---|
| 2024/0107809 A1* | 3/2024 | Noh | H01L 27/1248 |
| 2024/0138184 A1* | 4/2024 | Kim | H10K 59/1213 |
| 2024/0172479 A1* | 5/2024 | Lim | H10K 59/1216 |
| 2024/0251607 A1* | 7/2024 | Choo | H10K 50/865 |
| 2024/0260317 A1* | 8/2024 | Lim | H10K 59/123 |

* cited by examiner

DISPLAY APPARATUS HAVING A LIGHT-EMITTING DEVICE AND A DRIVING CIRCUIT

CROSS-REFERENCE TO RELATED APPLICATIONS

This application claims the benefit of Republic of Korea Patent Application No. 10-2021-0091739 filed on Jul. 13, 2021, which is hereby incorporated by reference as if fully set forth herein.

BACKGROUND

Field

The present disclosure relates to a display apparatus in which a light-emitting device and a driving circuit are disposed in each pixel area.

Discussion of the Related Art

Generally, a display apparatus provides an image to user. For example, the display apparatus may include a plurality of pixel area. Each of the pixel areas may realize a specific color. For example, a light-emitting device may be disposed in each pixel area. The light-emitting device may emit light displaying a specific color. For example, the light-emitting device may include a light-emitting layer between a first electrode and a second electrode.

A driving circuit for controlling the operation of the light-emitting device may be disposed in each pixel area. For example, the driving circuit of each pixel area may provide a driving current for one frame to the light-emitting device of the corresponding pixel area. The driving circuit may include at least one thin film transistor. For example, the driving circuit may include a first thin film transistor having a first semiconductor pattern, a second thin film transistor having a second semiconductor pattern, and a storage capacitor.

The storage capacitor may have a stacked structure of capacitor electrodes. In order to improve process efficiency, each capacitor electrode of the storage capacitor may be simultaneously formed with one of the conductive layers constituting the first thin film transistor and the second thin film transistor. Thus, in the display apparatus, at least one of the capacitor electrodes in each pixel area may be disposed close to signal lines electrically connected to the corresponding driving circuit. And, in the display apparatus, the storage capacitor of each driving circuit may be formed in an area limited by the number of thin film transistors constituting the corresponding driving circuit and the arrangements of thin film transistors in the corresponding pixel area. Therefore, in the display apparatus, a voltage stored in the storage capacitor of each driving circuit may be distorted by a signal applied through the signal lines. That is, in the display apparatus, the quality of the realized image may be degraded.

SUMMARY

Accordingly, the present disclosure is directed to a display apparatus that substantially obviates one or more problems due to limitations and disadvantages of the related art.

An object of the present disclosure is to provide a display apparatus capable of reducing or minimizing the degradation of process efficiency and improving the quality of the image.

Another object of the present disclosure is to provide a display apparatus in which a voltage stored in the storage capacitor in each driving circuit may be stably maintained.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. A separation insulating layer and a first thin film transistor are disposed on the device substrate. The first thin film transistor includes a first semiconductor pattern. The first semiconductor pattern is disposed between the device substrate and the separation insulating layer. A second thin film transistor and a storage capacitor are disposed on the separation insulating layer. The second thin film transistor includes a second semiconductor pattern. The second semiconductor pattern includes a material different from the first semiconductor pattern. The storage capacitor includes a first capacitor electrode and a second capacitor electrode, which are sequentially stacked. The first capacitor electrode has a stacked structure of a first electrode layer and a second electrode layer. The first electrode layer includes the same material as the second semiconductor pattern. The second electrode layer includes a material having lower resistance than the first electrode layer. An over-coat layer is disposed on the first thin film transistor, the second thin film transistor and the storage capacitor. A light-emitting device is disposed on the over-coat layer. The light-emitting device is electrically connected to the second thin film transistor.

The first semiconductor pattern may include polycrystalline silicon, and the second semiconductor pattern may include oxide semiconductor.

A third thin film transistor may be disposed on the separation insulating layer. The third thin film transistor may be spaced away from the second thin film transistor and the storage capacitor. The third thin film transistor may include a third semiconductor pattern. The third semiconductor pattern may be disposed on the same layer as the second semiconductor pattern.

The third semiconductor pattern may include an oxide semiconductor.

The second electrode layer may be in contact with an upper surface of the first electrode layer opposite to the device substrate.

A side of the first electrode layer may be continuous with a side of the second electrode layer.

The second capacitor electrode may include the same material as a gate electrode of the second thin film transistor.

A gate insulating layer of the second thin film transistor may extend between the first capacitor electrode and the second capacitor electrode.

In another embodiment, there is provided a display apparatus comprising a device substrate. A first thin film transistor, a second thin film transistor and a storage capacitor are disposed on the device substrate. The first thin film transistor includes a first semiconductor pattern, a first gate insulating layer, a first gate electrode, a first source electrode and a first drain electrode. The second thin film transistor is spaced away from the first thin film transistor. The second thin film transistor includes a second semiconductor pattern, a second gate insulating layer, a second gate electrode, a second source electrode and a second drain electrode. The second semiconductor pattern includes an oxide semiconductor. The storage capacitor is spaced away from the first thin film transistor and the second thin film transistor. The storage capacitor has a stacked structure of a first capacitor electrode, a capacitor insulating layer and a second capacitor electrode. The first capacitor electrode has a stacked structure of a first electrode layer and a second electrode layer. The first electrode layer includes an oxide semiconductor. The second electrode layer includes a material having higher electrical conductivity than the first electrode layer. The second semiconductor pattern and the first electrode layer are disposed on a layer different from the first semiconductor pattern. An over-coat layer is disposed on the first thin film transistor, the second thin film transistor and the storage capacitor. A light-emitting device is disposed on the over-coat layer. The light-emitting device has a stacked structure of a first electrode, a light-emitting layer and a second electrode.

A separation insulating layer may be disposed between the device substrate and the second thin film transistor. The separation insulating layer may cover the first gate electrode of the first thin film transistor. An upper interlayer insulating layer may be disposed between the separation insulating layer and the over-coat layer. The upper interlayer insulating layer may cover the storage capacitor. The first source electrode, the first drain electrode, the second source electrode and the second drain electrode may be disposed between the upper interlayer insulating layer and the over-coat layer.

The second semiconductor pattern may include a source region, a drain region and a channel region. The channel region may be disposed between the source region and the drain region. The second thin film transistor may include a source connecting pattern and a drain connecting pattern. The source connecting pattern may be disposed between the source region of the second semiconductor pattern and the second source electrode. The drain connecting pattern may be disposed between the drain region of the second semiconductor pattern and the second drain electrode. The source connecting pattern and the drain connecting pattern may include the same material as the second electrode layer of the first capacitor electrode.

The source region and the drain region of the second semiconductor pattern may have the same resistance as the channel region of the second semiconductor pattern.

The source connecting pattern may be in contact with an upper surface of the source region of the second semiconductor pattern. The drain connecting pattern may be in contact with an upper surface of the drain region of the second semiconductor pattern.

Each of the source connecting pattern and the drain connecting pattern may include a side being vertically aligned with a side of the second semiconductor pattern.

A horizontal width of the second gate electrode may be smaller than a distance between the source region and the drain region of the second semiconductor pattern.

The second semiconductor pattern may further comprise a source low-resistance region and a drain low-resistance region. The source low-resistance region may be disposed between the source region and the channel region. The drain low-resistance region may be disposed between the channel region and the drain region. The source low-resistance region and the drain low-resistance region of the second semiconductor pattern may have lower resistance than the channel region of the second semiconductor pattern, respectively.

The second gate insulating layer, the source connecting pattern and the drain connecting pattern may expose the source low-resistance region and the drain low-resistance region of the second semiconductor pattern. The source low-resistance region and the drain low-resistance region of the second semiconductor pattern may include a conductorized region of an oxide semiconductor.

In yet another embodiment, there is provided a display apparatus. The display apparatus includes a first thin film transistor (TFT) on a device substrate, the first thin film transistor including at least a first semiconductor pattern, a first gate electrode, and a first source electrode and a first drain electrode connected to the first semiconductor pattern. At least one of the first source electrode or the first drain electrode may be electrically connected to a data line, and wherein the first gate electrode is electrically connected to a scan line. The display apparatus also includes a second thin film transistor on the device substrate, the second TFT including at least a second semiconductor pattern, a second gate electrode, and a second source electrode and a second drain electrode connected to the second semiconductor pattern. At least one of the second source electrode or the second drain electrode may be electrically connected to a voltage supply line and the remaining one of the second source electrode and the drain electrode is electrically connected to a light-emitting device. The display apparatus also includes a storage capacitor including a first capacitor electrode and a second capacitor electrode. At least one of the first capacitor electrode and the second capacitor electrode may be disposed on a layer different than one or more layers the data line, the scan line, and the voltage supply line is disposed on.

The display apparatus may include a separation insulating layer on the first gate electrode of the first TFT, and the at least one of the first capacitor electrode and the second capacitor electrode may be disposed on the separation insulating layer.

The separation insulating layer may be disposed under the second TFT.

The display apparatus may include an interlayer insulating layer on the storage capacitor. At least a part of the first source electrode, the first drain electrode, the second source electrode, or the second drain electrode may be disposed on the interlayer insulating layer, and the data line and the voltage supply line may be disposed on the interlayer insulating layer.

The display apparatus may include a first gate insulating layer, and at least the first gate insulating layer may be between the first gate electrode and the first semiconductor pattern. The scan line may be disposed on the first gate insulating layer.

The first capacitor electrode may include a first electrode layer and a second electrode layer on the first electrode layer, and the first electrode layer may include a same material as the second semiconductor pattern.

The second TFT may include a source connecting pattern between a source region of the second semiconductor pattern and the second source electrode, a drain connecting pattern between a drain region of the second semiconductor pattern and the second drain electrode, and the source connecting pattern and the drain connecting pattern may include a same material as the second electrode layer of the second electrode layer.

The second capacitor electrode of the storage capacitor may include a same material as the second gate electrode.

Each of the first capacitor electrode and the second capacitor electrode may be disposed on layers different from the one or more layers the data line, the scan line, and the voltage supply line are disposed on.

The first semiconductor pattern may include polycrystalline silicon, and the second semiconductor pattern may include oxide semiconductor.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure.

DETAILED DESCRIPTION

Figure 1:
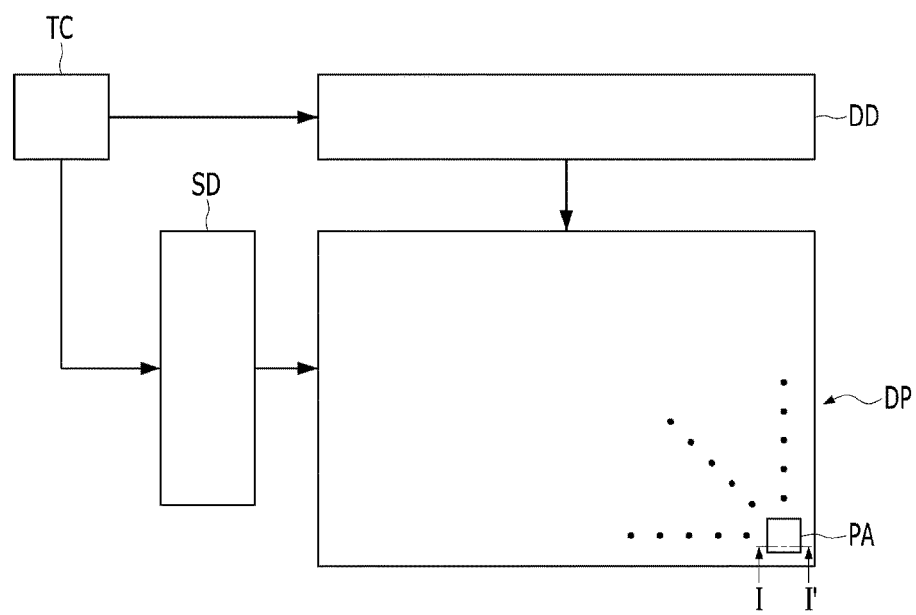
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figure 2:
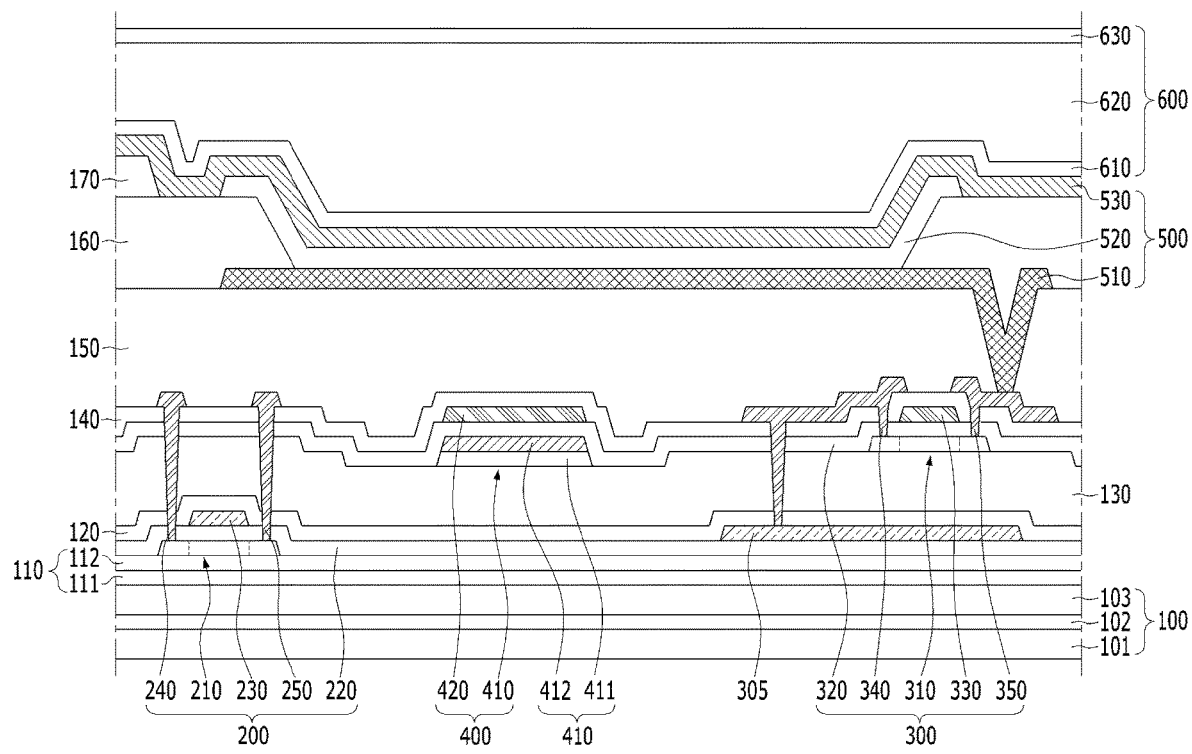
FIG. 2 is a cross-section according to I-I' of FIG. 1 according to an embodiment of the present disclosure.

FIG. 1 is a view schematically showing a display apparatus according to an embodiment of the present disclosure. FIG. 2 is a cross-section according to I-I' of FIG. 1 according to an embodiment of the present disclosure.

Referring to FIGS. 1 and 2, the display apparatus according to the embodiment of the present disclosure may include a display panel DP and driving parts SD, DD and TC. The display panel DP may realize an image which may be provided to a user. For example, the display panel DP may include a plurality of pixel area PA. The driving parts SD, DD and TC may provide various signals for realizing the image to each pixel area PA of the display panel DP. For example, the driving parts SD, DD and TC may include a scan driver SD, a data driver DD and a timing controller TC.

The scan driver SD may sequentially apply a scan signal to each pixel area PA of the display panel DP through scan lines. The data driver DD may apply a data signal to each pixel area PA of the display panel DP through data lines. The timing controller TC may control the operation of the scan driver SD and the operation of the data driver DD. For example, the timing controller TC may supply clock signals, reset clock signals and start signals to the scan driver SD, and supply a digital video data and a source timing control signal to the data driver DD.

Each pixel area PA of the display panel DP may realize a specific color. For example, a light-emitting device 500 may be disposed in each pixel area PA. The light-emitting device 500 may emit light displaying a specific color. For example, the light-emitting device 500 may include a first electrode 510, a light-emitting layer 520 and a second electrode 530, which are sequentially stacked.

The first electrode 510 may include a conductive material. The first electrode 510 may include a material having a high reflectance. For example, the first electrode 510 may include a metal, such as aluminum (Al) and silver (Ag). The first electrode 510 may have a multi-layer structure. For example, the first electrode 510 may have a structure in which a reflective electrode made of a metal is interposed between transparent electrodes made of transparent conductive material, such as ITO and IZO.

The light-emitting layer 520 may generate light having luminance corresponding to a voltage difference between the first electrode 510 and the second electrode 520. For example, the light-emitting layer 520 may include an emission material layer (EML) having an emission material. The emission material may include an organic material, an inorganic material or a hybrid material. For example, the display panel DP of the display apparatus according to the embodiment of the present disclosure may be an organic light-emitting display apparatus. The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 520 in each pixel area PA may be improved.

The second electrode 530 may include a conductive material. The second electrode 530 may include a material different from the first electrode 510. The transmittance of the second electrode 530 may be higher than the transmittance of the first electrode 510. For example, the second electrode 530 may include a transparent conductive material, such as ITO and IZO. Thus, in the display apparatus according to the embodiment of the present disclosure, the light generated by the light-emitting layer 520 of each pixel area PA may be emitted to the outside through the second electrode 530 of the corresponding pixel area PA.

The light-emitting device 500 of each pixel area PA may be supported by a device substrate 100. The device substrate 100 may have a multi-layer structure. For example, the device substrate 100 may have a stacked structure of a first substrate layer 101, a substate insulating layer 102 and a second substrate layer 103. The second substrate layer 103 may include the same material as the first substrate layer 101. For example, the first substrate layer 101 and the second substrate layer 103 may include a polymer material, such as poly-imide (PI). The substrate insulating layer 102 may include an insulating material. For example, the substate insulating layer 102 may include an inorganic insulating material, such as silicon oxide (SiO) and silicon nitride (SiN). Thus, in the display panel DP of the display apparatus according to the embodiment of the present disclosure, the damage of the device substrate 100 and/or the light-emitting device 500 due to external impact and bending may be prevented.

A driving circuit may be disposed on each pixel area PA of the device substrate 100. The driving circuit of each pixel area PA may be electrically connected to the driving parts SD, DD and TC. For example, the driving circuit of each pixel area PA may be electrically connected to one of the scan lines and one of the data lines. The driving circuit of each pixel area PA may generate a driving current corresponding to the data signal according to the scan signal. For example, the driving circuit of each pixel area PA may include a first thin film transistor 200 and a second thin film transistor 300.

The first thin film transistor 200 may include a first semiconductor pattern 210, a first gate insulating layer 220, a first gate electrode 230, a first source electrode 240 and a first drain electrode 250.

The first semiconductor pattern 210 may be disposed close to the device substrate 100. The first semiconductor pattern 210 may include a semiconductor material. For example, the first semiconductor pattern 210 may include a low-temperature poly-Si (LTPS). The first semiconductor pattern 210 may include a first source region, a first channel region and a first drain region. The first channel region may be disposed between the first source region and the first drain region. The first source region and the first drain region may have a lower resistance than the first channel region. For example, the first source region and the first drain region may include conductive impurities.

The first gate insulating layer 220 may be disposed on the first semiconductor pattern 210. The first gate insulating layer 220 may extend beyond the first semiconductor pattern 210. For example, a side of the first semiconductor pattern 210 may be covered by the first gate insulating layer 220. The first gate insulating layer 220 may include an insulating material. For example, the first gate insulating layer 220 may include an inorganic insulating material, such as silicon oxide (SiO) and silicon nitride (SiN).

The first gate electrode 230 may be disposed on the first gate insulating layer 220. The first gate electrode 230 may include a conductive material. For example, the first gate electrode 230 may include a metal, such as aluminum (Al), titanium (Ti), copper (Cu), chrome (Cr), molybdenum (Mo) and tungsten (W). The first gate electrode 230 may be insulated from the first semiconductor pattern 210 by the first gate insulating layer 220. The first gate electrode 230 may overlap the first channel region of the first semiconductor pattern 210. For example, the first channel region of the first semiconductor pattern 210 may have an electrical conductivity corresponding to a voltage applied to the first gate electrode 230.

The first source electrode 240 may be disposed on the first gate insulating layer 220. The first source electrode 240 may include a conductive material. For example, the first source electrode 240 may include a metal, such as aluminum (Al), titanium (Ti), copper (Cu), chrome (Cr), molybdenum (Mo) and tungsten (W). The first source electrode 240 may be insulated from the first gate electrode 230. The first source electrode 240 may include a material different from the first gate electrode 230. The first source electrode 240 may be disposed on a layer different from the first gate electrode 230. For example, a lower interlayer insulating layer 120 may be disposed on the first gate electrode 230, and the first source electrode 240 may be disposed on the lower interlayer insulating layer 120. The lower interlayer insulating layer 120 may include an insulating material. For example, the lower interlayer insulating layer 120 may include an inorganic insulating material, such as silicon oxide (SiO) and silicon nitride (SiN). The lower interlayer insulating layer 120 may extend beyond the first semiconductor pattern 210 and the first gate electrode 230. For example, a side of the first gate electrode 230 may be covered by the lower interlayer insulating layer 120.

The first source electrode 240 may be electrically connected to the first source region of the first semiconductor pattern 210. For example, the first gate insulating layer 220 and the lower interlayer insulating layer 120 may include a first source contact hole partially exposing the first source region of the first semiconductor pattern 210. The first source electrode 240 may be in direct contact with the first source region of the first semiconductor pattern 210 through the first source contact hole.

The first drain electrode 250 may be disposed on the first gate insulating layer 220. The first drain electrode 250 may include a conductive material. For example, the first drain electrode 250 may include a metal, such as aluminum (Al), titanium (Ti), copper (Cu), chrome (Cr), molybdenum (Mo)

and tungsten (W). The first drain electrode 250 may be insulated from the first gate electrode 230. The first drain electrode 250 may include a material different from the first gate electrode 230. The first drain electrode 250 may be disposed on a layer different from the first gate electrode 230. For example, the first drain electrode 250 may be disposed on the lower interlayer insulating layer 120. The first drain electrode 250 may be disposed on the same layer as the first source electrode 240. For example, the first drain electrode 250 may include the same material as the first source electrode 240.

The first drain electrode 250 may be electrically connected to the first drain region of the first semiconductor pattern 210. For example, the first gate insulating layer 220 and the lower interlayer insulating layer 120 may include a first drain contact hole partially exposing the first drain region of the first semiconductor pattern 210. The first drain electrode 250 may be in direct contact with the first drain region of the first semiconductor pattern 210.

The second thin film transistor 300 may have the same or similar structure as the first thin film transistor 200. For example, the second thin film transistor 300 may include a second semiconductor pattern 310, a second gate insulating layer 320, a second gate electrode 330, a second source electrode 340 and a second drain electrode 350.

The second semiconductor pattern 310 may include a semiconductor material. The second semiconductor pattern 310 may include a material different from the first semiconductor pattern 210. For example, the second semiconductor pattern 310 may include an oxide semiconductor, such as IGZO. The second semiconductor pattern 310 may include a second source region, a second channel region and a second drain region. The second channel region may be disposed between the second source region and the second drain region. The second source region and the second drain region may have a lower resistance than the second channel region. For example, the second source region and the second drain region may include conductive impurities.

The second semiconductor pattern 310 may be disposed on a layer different from the first semiconductor pattern 210. For example, a separation insulating layer 130 may be disposed on the lower interlayer insulating layer 120, and the second semiconductor pattern 310 may be disposed on the separation insulating layer 130. The separation insulating layer 130 may include an insulating material. For example, the separation insulating layer 130 may includes an inorganic insulating material, such as silicon oxide (SiO). The separation insulating layer 130 may be thicker than the lower interlayer insulating layer 120. Thus, in the display panel DP of the display apparatus according to the embodiment of the present disclosure, the damage of the first semiconductor pattern 210 due to the process of forming the second semiconductor pattern 310 may be prevented.

The second gate insulating layer 320 may be disposed on the second semiconductor pattern 310. The second gate insulating layer 320 may extend beyond the second semiconductor pattern 310. For example, a side of the second semiconductor pattern 310 may be covered by the second gate insulating layer 320. The second gate insulating layer 320 may include an insulating material. For example, the second gate insulating layer 320 may include an inorganic insulating material, such as silicon oxide (SiO).

The second gate electrode 330 may be disposed on the second gate insulating layer 320. The second gate electrode 330 may include a conductive material. For example, the second gate electrode 330 may include a metal, such as aluminum (Al), titanium (Ti), copper (Cu), chrome (Cr), molybdenum (Mo) and tungsten (W). The second gate electrode 330 may be insulated from the second semiconductor pattern 310 by the second gate insulating layer 320. The second gate electrode 330 may overlap the second channel region of the second semiconductor pattern 310. For example, the second channel region of the second semiconductor pattern 310 may have an electrical conductivity corresponding to a voltage applied to the second gate electrode 330.

The second source electrode 340 may be disposed on the second gate insulating layer 320. The second source electrode 340 may include a conductive material. For example, the second source electrode 340 may include a metal, such as aluminum (Al), titanium (Ti), copper (Cu), chrome (Cr), molybdenum (Mo) and tungsten (W). The second source electrode 340 may be insulated from the second gate electrode 330. The second source electrode 340 may include a material different from the second gate electrode 330. The second source electrode 340 may be disposed on a layer different from the second gate electrode 330. For example, an upper interlayer insulating layer 140 may be disposed on the second gate electrode 330, and the second source electrode 340 may be disposed on the upper interlayer insulating layer 140. The upper interlayer insulating layer 140 may include an insulating material. For example, the upper interlayer insulating layer 140 may include an inorganic insulating material, such as silicon oxide (SiO). The upper interlayer insulating layer 140 may extend beyond the second semiconductor pattern 310 and the second gate electrode 330. For example, a side of the second gate electrode 330 may be covered by the upper interlayer insulating layer 140.

The second source electrode 340 may include the same material as the first source electrode 240 and the first drain electrode 250. The first source electrode 240 and the first drain electrode 250 may be disposed on the same layer as the second source electrode 340. For example, the first source electrode 240 and the first drain electrode 250 may be disposed on the upper interlayer insulating layer 140. The first source contact hole and the first drain contact hole may penetrate the separation insulating layer 130, the second gate insulating layer 320 and the upper interlayer insulating layer 140.

The second source electrode 340 may be electrically connected to the second source region of the second semiconductor pattern 310. For example, the second gate insulating layer 320 and the upper interlayer insulating layer 140 may include a second source contact hole partially exposing the second source region of the second semiconductor pattern 310. The second source electrode 340 may be in direct contact with the second source region of the second semiconductor pattern 310 through the second source contact hole.

The second drain electrode 350 may be disposed on the second gate insulating layer 320. The second drain electrode 350 may include a conductive material. For example, the second drain electrode 350 may include a metal, such as aluminum (Al), titanium (Ti), copper (Cu), chrome (Cr), molybdenum (Mo) and tungsten (W). The second drain electrode 350 may be insulated from the second gate electrode 330. The second drain electrode 350 may include a material different from the second gate electrode 330. The second drain electrode 350 may be disposed on a layer different from the second gate electrode 330. For example, the second drain electrode 350 may be disposed on the upper interlayer insulating layer 140. The second drain electrode 350 may be disposed on the same layer as the second source electrode 340. For example, the second drain electrode 350 may include the same material as the second source electrode 340.

The second drain electrode 350 may be electrically connected to the second drain region of the second semiconductor pattern 310. For example, the second gate insulating layer 320 and the upper interlayer insulating layer 140 may include a second drain contact hole partially exposing the second drain region of the second semiconductor pattern 310. The second drain electrode 350 may be in direct contact with the second drain region of the second semiconductor pattern 310 through the second drain contact hole.

The first thin film transistor 200 in each driving circuit may transmit the data signal according to the scan signal. For example, in each pixel area, the first gate electrode 210 of the first thin film transistor 200 may be electrically connected to one of the scan lines, and the first source electrode 240 of the first thin film transistor 200 may be electrically connected to one of the data lines. The scan lines and the data lines may be formed by a process of forming the first thin film transistor 200 in each pixel area PA. For example, the scan lines may be disposed on the same layer as the first gate electrode 230 of each driving circuit, and the data lines may be disposed on the same layer as the first source electrode 240 and the first drain electrode 250 of each driving circuit. For example, the data lines may be disposed on the upper interlayer insulating layer 140, and the scan lines may be disposed on the first gate insulating layer 220. The scan lines may include the same material as the first gate electrode 230 of each driving circuit. The data lines may include the same material as the first source electrode 240 and the first drain electrode 250 of each driving circuit.

The second thin film transistor 300 of each driving circuit may generate a driving current corresponding to the data signal. For example, the second thin film transistor 300 of each driving circuit may function as a driving thin film transistor. In each pixel area PA, the second gate electrode 330 of the second thin film transistor 300 may be electrically connected to the first drain electrode 250 of the first thin film transistor 200, and the second source electrode 340 of the second thin film transistor 300 may be electrically connected to one of the power voltage supply lines. The power voltage supply lines may be formed by a process of forming the second thin film transistor 300 in each pixel area PA. For example, the power voltage supply lines may be disposed on the same layer as the second source electrode 340 and the second drain electrode 350 of each driving circuit. The power voltage supply lines may be disposed on the same layer as the data lines. For example, the data lines and the power voltage supply lines may be disposed on the upper interlayer insulating layer 140. The power voltage supply lines may be spaced away from the data lines. The power voltage supply lines may include the same material as the second source electrode 340 and the second drain electrode 350. The power voltage supply lines may include the same material as the data lines.

The light-emitting device 500 of each pixel area PA may be electrically connected to the driving circuit of the corresponding pixel area PA. The driving current generated by the driving circuit of each pixel area PA may be supplied to the light-emitting device 500 of the corresponding pixel area PA. For example, the first electrode 510 of the light-emitting device 500 in each pixel area PA may be electrically connected to the second drain electrode 350 of the second thin film transistor 300 in the corresponding pixel area PA. The first electrode 510 of each pixel area PA may be disposed on a layer different from the second drain electrode 350 of the corresponding pixel area PA. For example, an over-coat layer 150 may be disposed on the driving circuit of each pixel area PA, and the light-emitting device 500 of each pixel area PA may be disposed on the over-coat layer 150. The over-coat layer 150 may include an insulating material. The over-coat layer 150 may include a material different from the upper interlayer insulating layer 140. For example, the over-coat layer 150 may include an organic insulating material. A thickness difference due to the driving circuit of each pixel area PA may be removed by the over-coat layer 150. For example, an upper surface of the over-coat layer 150 opposite to the device substrate 100 may be a flat surface.

The first electrode 510 of each pixel area PA may be electrically connected to the second drain electrode 350 of the corresponding pixel area PA by penetrating the over-coat layer 150. For example, the over-coat layer 150 may include electrode contact holes partially exposing the second drain electrode 350 of each pixel area PA. The first electrode 510 of each pixel area PA may be in direct contact with the second drain electrode 350 of the corresponding pixel area PA through one of the electrode contact holes.

The storage capacitor 400 may have a stacked stricture of capacitor electrodes 410 and 420. For example, the storage capacitor 400 may have a stacked structure of a first capacitor electrode 410 and a second capacitor electrode 420. The storage capacitor 400 may be disposed close to the second thin film transistor 300. For example, the first capacitor electrode 410 and the second capacitor electrode 420 may be sequentially stacked on the separation insulating layer 130. Thus, in the display apparatus according to the embodiment of the present disclosure, the degradation of luminance due to the resistance of wire connecting the storage capacitor 400 and the second gate electrode 330 of the second thin film transistor 300 in each pixel area PA may be reduced or minimized. And, in the display apparatus according to the embodiment of the present disclosure, the distortion of the voltage stored in the storage capacitor 400 due to the conductive layers in each pixel area PA may be reduced or minimized.

The first capacitor electrode 410 may have a stacked structure of a first electrode layer 411 and a second electrode layer 412. The first electrode layer 411 may be disposed on the same layer as the second semiconductor pattern 310 of the second thin film transistor 300. The first electrode layer 411 may be made of the same material as the second semiconductor pattern 310 of the second thin film transistor 300. For example, the first electrode layer 411 may include an oxide semiconductor. The second electrode layer 412 may be in contact with an upper surface of the first electrode layer 411 opposite to the device substrate 100. For example, a side of the first electrode layer 411 may be vertically aligned with a side of the second electrode layer 412. The second electrode layer 412 may include a material having a lower resistance than the first electrode layer 411. For example, the second electrode layer 412 may include a metal, such as aluminum (Al), titanium (Ti), copper (Cu), chrome (Cr), molybdenum (Mo) and tungsten (W). The second electrode layer 412 may have a electrical conductivity higher than the first electrode layer 411.

The second capacitor electrode 420 may overlap the first capacitor electrode 410. The second capacitor electrode 420 may include a conductive material. The second capacitor electrode 420 may be insulated from the first capacitor electrode 410. For example, the second gate insulating layer 320 of the second thin film transistor 300 may be extended between the first capacitor electrode 410 and he second capacitor electrode 420. The upper interlayer insulating layer 140 may be disposed on the second capacitor electrode 420. For example, the second capacitor electrode 420 may be disposed on the same layer as the second gate electrode 330 of the second thin film transistor 300. The second capacitor electrode 420 may include the same material as the second gate electrode 330 of the second thin film transistor 300.

In the display apparatus according to the embodiment of the present disclosure, the capacitor electrodes 410 and 420 of the storage capacitor 400 in each pixel area PA may be a layer different from signal wires electrically connected to the corresponding pixel area PA, such as the scan lines, the data lines, and the power voltage supply lines. Thus, In one embodiment, at least one of the capacitor electrodes 410 and 420 may be disposed on a layer different than one or more layers the data lines, the scan lines, or the voltage supply lines are disposed on. Thus, in the display apparatus according to the embodiment of the present disclosure, the distortion of the voltage stored in the storage capacitor 400 of each driving circuit due to the signal applied through the signal wires may be prevented. And, in the display apparatus according to the embodiment of the present disclosure, a size of the storage capacitor 400 in each pixel area PA may be increased. Therefore, in the display apparatus according to the embodiment of the present disclosure, the voltage stored in the storage capacitor 400 of each driving circuit may be stably maintained.

A buffer insulating layer 110 may be disposed between the device substrate 100 and each driving circuit. The buffer insulating layer 110 may prevent pollution due to the device substrate 100 in a process of forming each driving circuit. For example, an upper surface of the device substrate 100 facing the first thin film transistor 200, the second thin film transistor 300 and the storage capacitor 400 of each driving circuit may be completely covered by the buffer insulating layer 110. The buffer insulating layer 110 may include an insulating material. For example, the buffer insulating layer 110 may include an inorganic insulating material, such as silicon oxide (SiO) and silicon nitride (SiN). The buffer insulating layer 110 may have a multi-layer structure. For example, the buffer insulating layer 110 may have a stacked structure of a first buffer layer 111 and a second buffer layer 112. The second buffer layer 112 may include a material different from the first buffer layer 111. For example, the buffer insulating layer 110 may have a stacked structure of a layer made of silicon oxide (SiO) and a layer made of silicon nitride (SiN).

A light-blocking pattern 305 may be disposed between the device substrate 100 and the second thin film transistor 300 of each driving circuit. The light-blocking pattern 305 may prevent a change in characteristics of the second thin film transistor 300 in each pixel area PA due to external light. For example, the second semiconductor pattern 310 of each driving circuit may overlap the light-blocking pattern 305. The light-blocking pattern 305 may include a material capable of blocking or absorbing the light. For example, the light-blocking pattern 305 may include a metal, such as aluminum (Al), titanium (Ti), copper (Cu), chrome (Cr), molybdenum (Mo) and tungsten (W). The light-blocking pattern 305 may be disposed on the same layer as the first gate electrode 230 of the first thin film transistor 200. For example, the light-blocking pattern 305 may be disposed between the first gate insulating layer 220 and the lower interlayer insulating layer 120. The light-blocking pattern 305 may include the same material as the first gate electrode 230 of each driving circuit.

A specific voltage may be applied to the light-blocking pattern. For example, in each pixel area PA, the light-blocking pattern 305 may be electrically connected to the second source electrode 340 of the second thin film transistor 300. The lower interlayer insulating layer 120, the separation insulating layer 130, the second gate insulating layer 320 and the upper interlayer insulating layer 140 may include light-blocking contact holes partially exposing the light-blocking pattern 305 of each pixel area PA. the second source electrode 340 of each pixel area PA may be in direct contact with the light-blocking pattern 305 in the corresponding pixel area PA through one of the light-blocking contact holes. Thus, in the display apparatus according to the embodiment of the present disclosure, the blocking of the external light by the light-blocking pattern 305 may be effectively performed.

The light-emitting device 500 of each pixel area PA may be controlled independently. For example, the first electrode 510 of the light-emitting device 500 in each pixel area PA may be insulated from the first electrode 510 of the light-emitting device 500 in adjacent pixel area PA. The first electrode 510 of the light-emitting device 500 in each pixel area PA may be spaced away from the first electrode 510 of the light-emitting device 500 in adjacent pixel area PA. A bank insulating layer 160 may be disposed between the first electrodes 510 of adjacent two pixel area PA. For example, the bank insulating layer 160 may cover an edge of the first electrode 510 in each pixel area PA. The light-emitting layer 520 and the second electrode 530 in each pixel area PA may be sequentially stacked on a portion of the corresponding first electrode 510 exposed by the bank insulating layer 160. The bank insulating layer may be in contact with the upper surface of the over-coat layer 150 between the first electrodes 510 of adjacent two pixel area PA. The bank insulating layer 160 may include an insulating material. For example, the bank insulating layer 160 may include an organic insulating material. The bank insulating layer 160 may include a material different from the over-coat layer 150.

The light-emitting device 500 of each pixel area PA may emit the light displaying a color different from the light-emitting device 500 of adjacent pixel area PA. For example, the light-emitting layer 520 in each pixel area PA may include an end disposed on the bank insulating layer 160. The light-emitting layer 520 of each pixel area PA may be formed individually. For example, a spacer 170 may be disposed on the bank insulating layer 160. The spacer 170 may be spaced away from the light-emitting layer 520 of each pixel area PA. The spacer 170 may include an insulating material. For example, the spacer 170 may include an organic insulating material. Thus, in the display apparatus according to the embodiment of the present disclosure, the damage of the bank insulating layer 160 and the light-emitting layer 520 disposed in adjacent pixel area PA in a process of forming the light-emitting layer 520 in each pixel area PA may be prevented.

The voltage applied to the second electrode 530 of each pixel area PA may be the same as the voltage applied to the second electrode 530 of adjacent pixel area PA. For example, the second electrode 530 of each pixel area PA may be electrically connected to the second electrode 530 of adjacent pixel area PA. The second electrode 530 of each pixel area PA may include the same material as the second electrode 530 of adjacent pixel area PA. For example, the second electrode 530 of each pixel area PA may be in direct contact with the second electrode 530 of adjacent pixel area PA. The second electrode 530 of each pixel area PA may extend on the bank insulating layer 160 and the spacer 170. Thus, in the display apparatus according to the embodiment of the present disclosure, the luminance of the light emitted from the light-emitting device 500 of each pixel area PA may be controlled by the driving current generated by the driving circuit of the corresponding pixel area PA.

An encapsulating element 600 may be disposed on the light-emitting device 500 of each pixel area PA. The encapsulating element 600 may prevent the damage of the light-emitting device in each pixel area PA due to external impact and moisture. The encapsulating element 600 may include an insulating material. The encapsulating element 600 may have a multi-layer structure. For example, the encapsulating element 600 may include a first encapsulating layer 610, a second encapsulating layer 620 and a third encapsulating layer 630, which are sequentially stacked. The second encapsulating layer 620 may include a material different from the first encapsulating layer 610 and the third encapsulating layer 630. For example, the first encapsulating layer 610 and the third encapsulating layer 630 may include an inorganic insulating material, and the second encapsulating layer 620 may include an organic insulating material. Thus, in the display apparatus according to the embodiment of the present disclosure, the damage of the light-emitting device 500 in each pixel area PA due to the external impact and moisture may be effectively prevented. A thickness difference by the light-emitting device 500 of each pixel area PA may be removed by the second encapsulating layer 620. For example, an upper surface of the encapsulating element 600 opposite to the device substrate 100 may be a flat surface.

FIGS. 3A to 3H are views sequentially showing a method of forming the display apparatus according to the embodiment of the present disclosure.

Figure 3A:
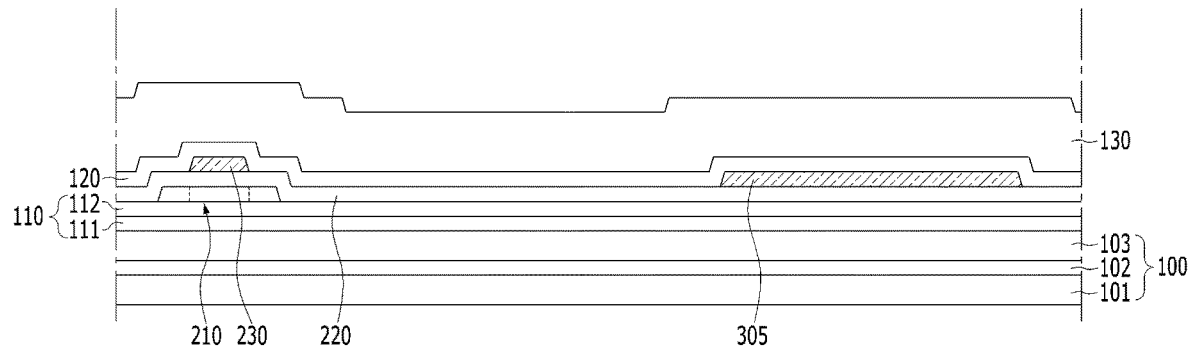
FIGS. 3A to 3H are views sequentially showing a method of forming the display apparatus according to the embodiment of the present disclosure.

The method of forming the display apparatus according to the embodiment of the present disclosure will be described with reference to FIGS. 2 and 3A to 3H. First, as shown in FIG. 3A, the method of forming the display apparatus according to the embodiment of the present disclosure may include a step of preparing a device substrate 100, a step of forming a buffer insulating layer 110 on the device substrate 100, a step of forming a first semiconductor pattern 210 on the buffer insulating layer 110, a step of forming a first gate insulating layer 220 covering the first semiconductor pattern 210, a step of forming a first gate electrode 230 and a light-blocking pattern 305 on the first gate insulating layer 220, a step of forming a lower interlayer insulating layer 120 covering the first gate electrode 230 and the light-blocking pattern 305, and a step of forming a separation insulating layer 130 on the lower interlayer insulating layer 120.

The device substrate 100 may have a multi-layer structure. For example, the step of preparing the device substrate 100 may include a step of coupling a first substrate layer 101, a substrate insulating layer 102 and a second substrate layer 103. The second substrate layer 103 may be formed of the same material as the first substrate layer 101. For example, the first substrate layer 101 and the second substrate layer 103 may be formed of a polymer material, such as poly-imide (PI). The substrate insulating layer 102 may be formed of an insulating material. For example, the substrate insulating layer 102 may be formed of an inorganic insulating material.

The buffer insulating layer 110 may be formed of an insulating material. For example, the buffer insulating layer 110 may be formed of an inorganic insulating material, such as silicon oxide (SiO) and silicon nitride (SiN). The buffer insulating layer 110 may have a multi-layer structure. For example, the step of forming the buffer insulating layer 110 may include a step of forming a first buffer layer 111 on the device substrate 100 and a step of forming a second buffer layer 112 on the first buffer layer 111. The second buffer layer 112 may be formed of a material different from the first buffer layer 111.

The first semiconductor pattern 210 may be formed of a semiconductor material. For example, the first semiconductor pattern 210 may be formed of a low-temperature poly-Si (LTPS). The step of forming the first semiconductor pattern 210 may include a deposition process and a crystallization process. For example, the step of forming the first semiconductor pattern 210 may include a step of forming an amorphous silicon layer on the buffer insulating layer 110, a step of forming a low-temperature poly-Si layer by crystallizing the amorphous silicon layer, a step of patterning the low-temperature poly-Si layer.

A first source region, a first channel region and a first drain region may be formed in the first semiconductor pattern 210. The first channel region may be formed between the first source region and the first drain region. The first source region and the first drain region may have a resistance lower than the first channel region. For example, the first source region and the first drain region may be formed by a doping process of conductive impurities. The first channel region may be a region which is not doped with the conductive impurities. The doping process of the conductive impurities to form the first source region and the first drain region may be performed after the first gate electrode 230 is formed. For example, a step of forming the first source region, the first channel region and the first drain region in the first semiconductor pattern 210 may include a step of forming the first gate electrode 230 overlapping with a central region of the first semiconductor pattern 210 on the first gate insulating layer 220, and a step of doping the conductive impurities into both ends of the first semiconductor pattern 210 exposed by the first gate electrode 230 using the first gate electrode 230 as a mask. Thus, in the method of forming the display apparatus according to the embodiment of the present disclosure, the first source region, the first channel region and the first drain region may be formed in the first semiconductor pattern 210, without additional mask for the doping process of the conductive impurities. Therefore, in the method of forming the display apparatus according to the embodiment of the present disclosure, the process efficiency may be improved.

The first gate insulating layer 220 may be formed of an insulating material. For example, the first gate insulating layer 220 may be formed of an inorganic insulating material, such as silicon oxide (SiO) and silicon nitride (SiN).

The first gate electrode 230 may be formed of a conductive material. For example, the first gate electrode 230 may be formed of a metal, such as aluminum (Al), titanium (Ti), copper (Cu), chrome (Cr), molybdenum (Mo) and tungsten (W). The light-blocking pattern 305 may be formed of the same material as the first gate electrode 230. For example, the step of forming the first gate electrode 230 and the light-blocking pattern 305 may include a step of forming a conductive material layer on the first gate insulating layer 220, and a step of patterning the conductive material layer. The light-blocking pattern 305 may be formed simultaneously with the first gate electrode 230. Thus, in the method of forming the display apparatus according to the embodiment of the present disclosure, an additional deposition process and an additional patterning process to form the light-blocking pattern 305 may be omitted. Therefore, in the method of forming the display apparatus according to the embodiment of the present disclosure, the process efficiency may be improved.

The lower interlayer insulating layer 120 and the separation insulating layer 130 may be formed of an insulating material. For example, the lower interlayer insulating layer 120 and the separation insulating layer 130 may be formed of an inorganic insulating material, such as silicon oxide (SiO) and silicon nitride (SiN). The separation insulating layer 130 may be formed of the same material as the lower interlayer insulating layer 120. For example, the lower interlayer insulating layer 120 and the separation insulating layer 130 may be formed of silicon oxide (SiO). The separation insulating layer 130 may be formed to be thicker than the lower interlayer insulating layer 120.

In the method of forming the display apparatus according to the embodiment of the present disclosure, scan lines for sequentially applying a scan signal to each pixel area PA may be formed simultaneously with the first gate electrode 230. For example, the scan lines may be formed between the first gate insulating layer 220 and the lower interlayer insulating layer 120.

Figure 3B:
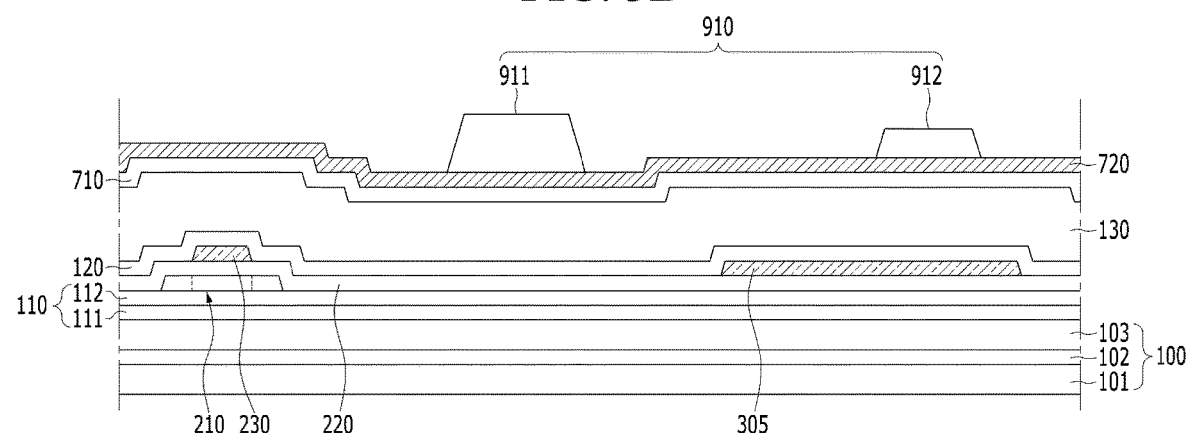

As shown in FIG. 3B, the method of forming the display apparatus according to the embodiment of the present disclosure may include a step of forming a semiconductor layer 710 on the separation insulating layer 130, a step of forming an electrode material layer 720 on the semiconductor material layer 710, and a step of forming a first mask pattern 910 on the electrode material layer 720.

The semiconductor material layer 710 may be formed of a semiconductor material. The semiconductor material layer 710 may be formed of a material different from the first semiconductor pattern 210. For example, the semiconductor material layer 710 may be formed of an oxide semiconductor, such as IGZO.

The electrode material layer 720 may be in direct contact with an upper surface of the semiconductor material layer 710 opposite to the device substrate 100. The electrode material layer 720 may be formed of a material having a resistance lower than the semiconductor material layer 710. For example, the electrode material layer 720 may be formed of a metal, such as aluminum (Al), titanium (Ti), copper (Cu), chrome (Cr), molybdenum (Mo) and tungsten (W). The electrode material layer 720 may have an electrical conductivity higher than the semiconductor material layer 710.

The first mask pattern 910 may include a first pattern portion 911 and a second pattern portion 912. The first pattern portion 911 may be formed on a region where a first capacitor electrode is to be formed by a subsequent process. For example, a lower surface of the first pattern portion 911 toward the device substrate 110 may have substantially the same horizontal width as an upper surface of the first capacitor electrode opposite to the device substrate 100. The second pattern portion 912 may be formed on a region where a second semiconductor pattern is to be formed by a subsequent process. For example, a lower surface of the second pattern portion 912 toward the device substrate 110 may have substantially the same horizontal width as an upper surface of the second semiconductor pattern opposite to the device substrate 100. The second pattern portion 912 may be formed to be thinner than the first pattern portion 911. For example, the first mask pattern 910 may be a half-tone mask.

Figure 3C:
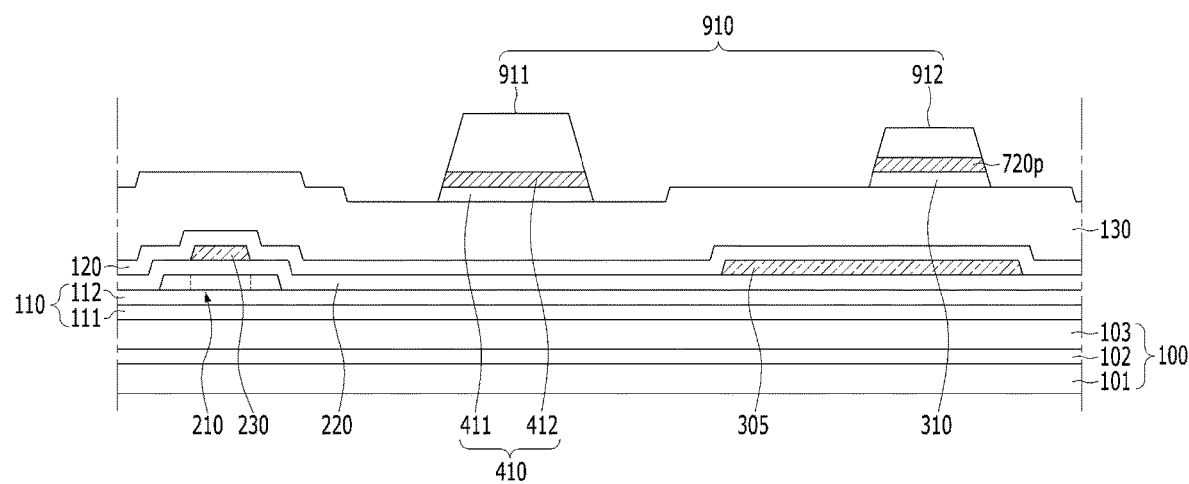

As shown in FIG. 3C, the method of forming the display apparatus according to the embodiment of the present disclosure may include a step of forming the first capacitor electrode 410, the second semiconductor pattern 310 and a dummy pattern 720p on the separation insulating layer 130.

The first capacitor electrode 410 may be formed between the separation insulating layer 130 and the first pattern portion 911. For example, the first capacitor electrode 410 may be formed in a stacked structure of a first electrode layer 411 and a second electrode layer 412. The first electrode layer 411 may include the same material as the semiconductor material layer 710. The second electrode layer 412 may include the same material as the electrode material layer 720. A lower surface of the second electrode layer 412 toward the device substrate 100 may be in direct contact with an upper surface of the first electrode layer 411 opposite to the device substrate 100.

The second semiconductor pattern 310 may be formed between the separation insulating layer 130 and the second pattern portion 912. The second semiconductor pattern 310 may include the same material as the semiconductor material layer 710. For example, the second semiconductor pattern 310 may be formed simultaneously with the first electrode layer 411. The dummy pattern 720p may be formed between the second semiconductor pattern 310 and the second pattern portion 912. For example, the dummy pattern 720p may include the same material as the electrode material layer 720. The dummy pattern 720p may be formed simultaneously with the second electrode layer 412. A lower surface of the dummy pattern 720p toward the device substrate 100 may be in direct contact with an upper surface of the second semiconductor pattern 310 opposite to the device substrate 100.

The step of forming the first capacitor electrode 410, the second semiconductor pattern 310 and the dummy pattern 720p may include a step of sequentially patterning the semiconductor material layer 710 and the electrode material layer 720 using the first mask pattern 910. For example, a side of the first electrode layer 411 may be continuously with a side of the second electrode layer 412, and a side of the second semiconductor pattern 310 may be continuously with a side of the dummy pattern 720p. The side of the first electrode layer 411 may be vertically aligned with the side of the second electrode layer 412. The side of the second semiconductor pattern 310 may be vertically aligned with the side of the dummy pattern 720p.

In the method of forming the display apparatus according to the embodiment of the present disclosure, the first capacitor electrode 410 having a stacked structure of the first electrode layer 411 made of the same material as the second semiconductor pattern 310 and the second electrode layer 412 made of a material having a resistance lower than the first electrode layer 411 may be formed simultaneously with the second semiconductor pattern 310 using the first mask pattern 910. Thus, in method of forming the display apparatus according to the embodiment of the present disclosure, the number of total masks may be reduced. Therefore, in the method of forming the display apparatus according to the embodiment of the present disclosure, the process efficiency may be improved.

Figure 3D:
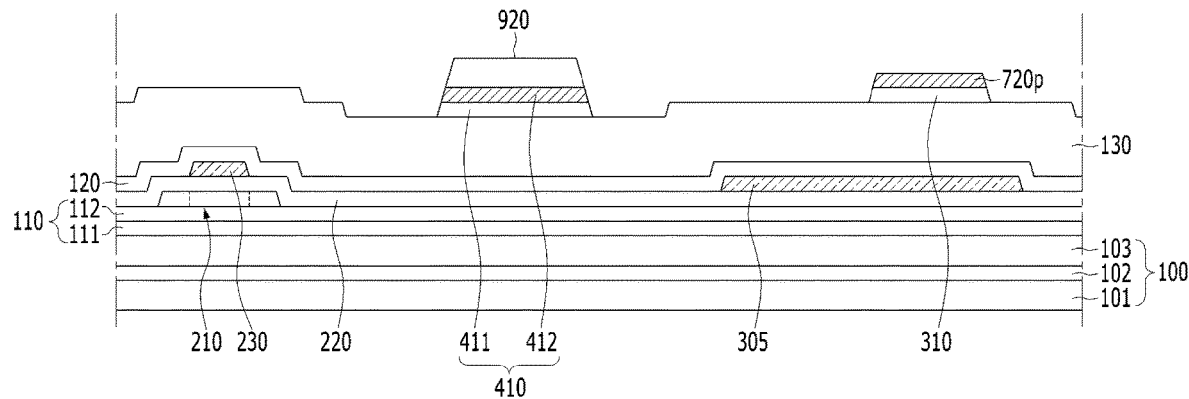

As shown in FIG. 3D, the method of forming the display apparatus according to the embodiment of the present disclosure may include a step of forming a second mask pattern 920 on the first capacitor electrode 410.

The dummy pattern 720p may be disposed outside the second mask pattern 920. For example, the step of forming the second mask pattern 920 may include a step of exposing an upper surface of the dummy pattern 720p opposite to the device substrate 100. The second mask pattern 920 may be formed using the first mask pattern 910. For example, the step of forming the second mask pattern 920 may include a step of completely removing the second pattern portion 912 of the first mask pattern 910 by a cleaning process. The second mask pattern 920 may be the first pattern portion 911 which is a remained region after the cleaning process.

Figure 3E:
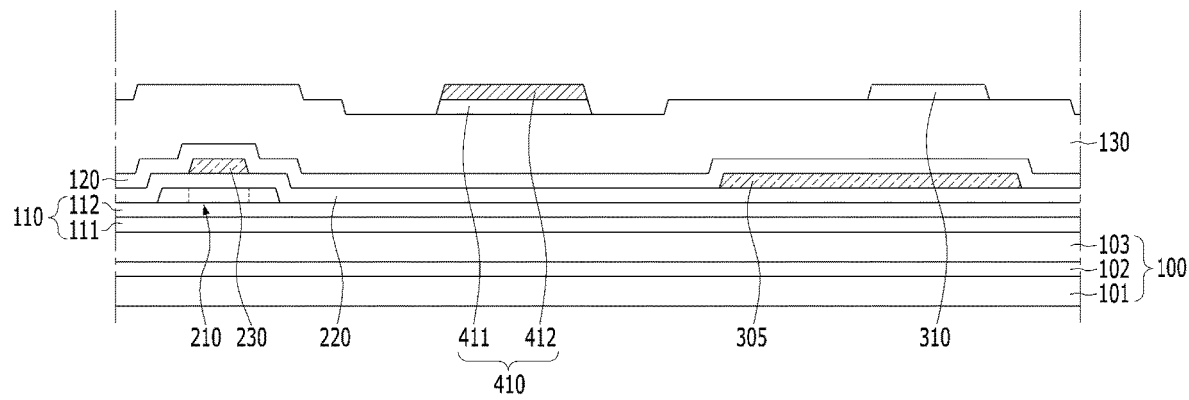

As shown in FIG. 3E, the method of forming the display apparatus according to the embodiment of the present disclosure may include a step of exposing the upper surface of the second semiconductor pattern 310, and a step of removing the second mask pattern 920.

The step of exposing the upper surface of the second semiconductor pattern 310 may include a step of completely removing the dummy pattern 720p using the second mask pattern 920. For example, the step of removing the second mask pattern 920 may be performed after the upper surface of the second semiconductor pattern 310 is exposed.

Figure 3F:
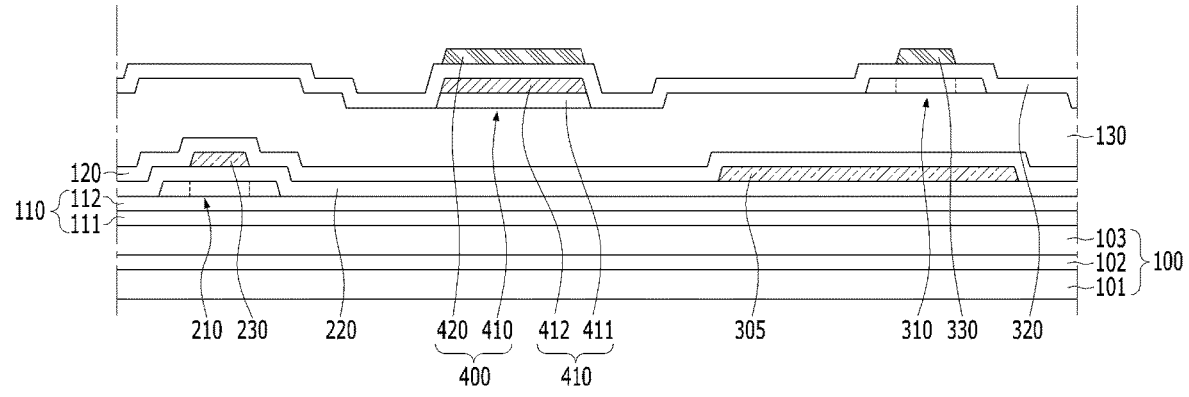

As shown in FIG. 3F, the method of forming the display apparatus according to the embodiment of the present disclosure may include a step of forming a second gate insulating layer 320 covering the first capacitor electrode 410 and the second semiconductor pattern 310, a step of forming a second gate electrode 330 and a second capacitor electrode 420 on the second gate insulating layer 320, and a step of forming a second source region, a second channel region and a second drain region in the second semiconductor pattern 310.

The second gate insulating layer 320 may be formed of an insulating material. For example, the second gate insulating layer 320 may be formed of an inorganic insulating material, such as silicon oxide (SiO).

The second gate electrode 330 may be formed of a conductive material. For example, the second gate electrode 330 may be formed of a metal, such as aluminum (Al), titanium (Ti), copper (Cu), chrome (Cr), molybdenum (Mo) and tungsten (W). The second gate electrode 330 may be formed to overlap with a portion of the second semiconductor pattern 310. For example, the second gate electrode 330 may be formed to overlap a central region of the second semiconductor pattern 310.

The second capacitor electrode 420 may be formed on the first capacitor electrode 410. The first capacitor electrode 410 and the second capacitor electrode 420 may constitute a storage capacitor 400. For example, the second capacitor electrode 420 may be formed to overlap the first capacitor electrode 410. The second capacitor electrode 420 may be formed of the same material as the second gate electrode 330. For example, the step of forming the second capacitor electrode 420 and the second gate electrode 330 may include a step of forming a conductive material layer on the second gate insulating layer 320, and a step of patterning the conductive material layer. The second capacitor electrode 420 may be formed simultaneously with the second gate electrode 330. Thus, in the method of forming the display apparatus according to the embodiment of the present disclosure, an additional deposition process and an additional patterning process to form the second capacitor electrode 420 may be omitted. Therefore, in the method of forming the display apparatus according to the embodiment of the present disclosure, the process efficiency may be improved.

The second channel region may be formed between the second source region and the second drain region. The second source region and the second drain region may have a resistance lower than the second channel region. For example, the second source region and the second drain region may be formed by a doping process of conductive impurities. The second channel region may be a region which is not doped with the conductive impurities. The doping process of the conductive impurities to form the second source region and the second drain region may be performed after the second gate electrode 330 is formed. For example, a step of forming the second source region, the second channel region and the second drain region in the second semiconductor pattern 310 may include a step of doping the conductive impurities into both ends of the second semiconductor pattern 310 exposed by the second gate electrode 330 using the second gate electrode 330 as a mask. Thus, in the method of forming the display apparatus according to the embodiment of the present disclosure, the second source region, the second channel region and the second drain region may be formed in the second semiconductor pattern 210, without additional mask for the doping process of the conductive impurities. Therefore, in the method of forming the display apparatus according to the embodiment of the present disclosure, the process efficiency may be improved.

Figure 3G:
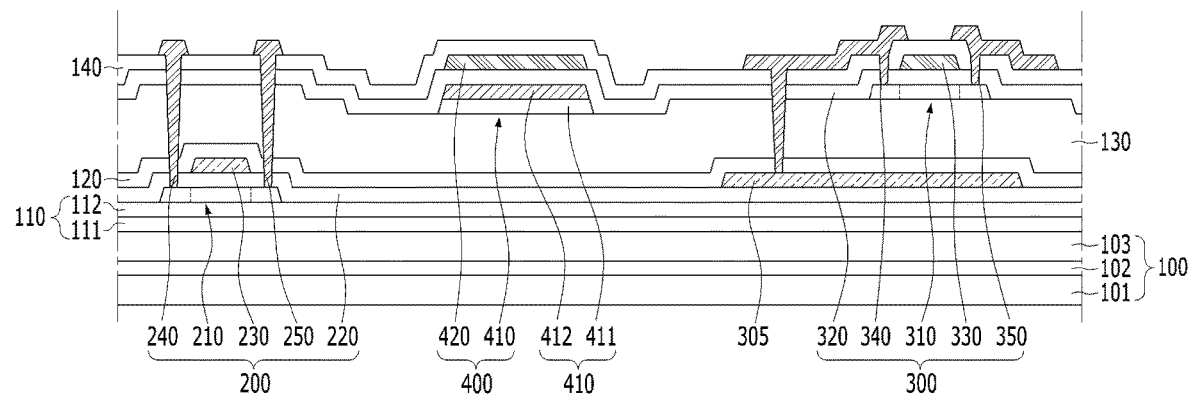

As shown in FIG. 3G, the method of forming the display apparatus according to the embodiment of the present disclosure may include a step of forming an upper interlayer insulating layer 140 covering the second gate electrode 330 and the second capacitor electrode 420, and a step of forming a first source electrode 240, a first drain electrode 250, a second source electrode 340 and a second drain electrode 350 on the upper interlayer insulating layer 140.

The upper interlayer insulating layer 140 may be formed of an insulating material. For example, the upper interlayer insulating layer 140 may be formed of an inorganic insulating material, such as silicon oxide (SiO).

The first source electrode 240, the first drain electrode 250, the second source electrode 340 and the second drain electrode 350 may be formed of a conductive material. For example, the first source electrode 240, the first drain electrode 250, the second source electrode 340 and the second drain electrode 350 may be formed of a metal, such as aluminum (Al), titanium (Ti), copper (Cu), chrome (Cr), molybdenum (Mo) and tungsten (W).

The first source electrode 240 may be electrically connected to the first source region of the first semiconductor pattern 210 by penetrating the first gate insulating layer 220, the lower interlayer insulating layer 120, the separation insulating layer 130, the second gate insulating layer 320 and the upper interlayer insulating layer 140. The first drain electrode 250 may be electrically connected to the first drain region of the first semiconductor pattern 210 by penetrating the first gate insulating layer 220, the lower interlayer insulating layer 120, the separation insulating layer 130, the second gate insulating layer 320 and the upper interlayer insulating layer 140. The second source electrode 340 may be electrically connected to the light-blocking pattern 305 by penetrating the lower interlayer insulating layer 120, the separation insulating layer 130, the second gate insulating layer 320 and the upper interlayer insulating layer 140. The second source electrode 340 may be electrically connected to the second source region of the second semiconductor pattern 310 by penetrating the second gate insulating layer 320 and the upper interlayer insulating layer 140. The second drain electrode 340 may be electrically connected to the second drain region of the second semiconductor pattern 310 by penetrating the second gate insulating layer 320 and the upper interlayer insulating layer 140.

The first source electrode 240, the first drain electrode 250, the second source electrode 340 and the second drain electrode 350 may be formed of the same material. For example, the step of forming the first source electrode 240, the first drain electrode 250, the second source electrode 340 and the second drain electrode 350 may include a step of forming a first source contact hole partially exposing the first source region of the first semiconductor pattern 210 by penetrating the first gate insulating layer 220, the lower interlayer insulating layer 120, the separation insulating layer 130, the second gate insulating layer 320 and the upper interlayer insulating layer 140, a step of forming a first drain contact hole partially exposing the first drain region of the first semiconductor pattern 210 by penetrating the first gate insulating layer 220, the lower interlayer insulating layer 120, the separation insulating layer 130, the second gate insulating layer 320 and the upper interlayer insulating layer 140, a step of forming a light-blocking connecting hole partially exposing the light-blocking pattern 305 by penetrating the lower interlayer insulating layer 120, the separation insulating layer 130, the second gate insulating layer 320 and the upper interlayer insulating layer 140, a step of forming a second source contact hole partially exposing the second source region of the second semiconductor pattern 310 by penetrating the second gate insulating layer 320 and the upper interlayer insulating layer 140, a step of forming a second drain contact hole partially exposing the second drain region of the second semiconductor pattern 310 by penetrating the second gate insulating layer 320 and the upper interlayer insulating layer 140, a step of forming a conductive material layer extending inwardly of the first source contact hole, the first drain contact hole, the light-blocking connecting hole, the second source contact hole and the second drain contact hole on the device substrate 100 in which the first source contact hole, the first drain contact hole, the light-blocking connecting hole, the second source contact hole and the second drain contact hole are formed, and a step of patterning the conductive material layer. The first drain contact hole may be formed simultaneously with the first source contact hole. The second drain contact hole may be formed simultaneously with the second source contact hole. The light-blocking connecting hole may be formed using a process to form the first source contact hole and the first drain contact hole. The first source electrode 240, the first drain electrode 250, the second source electrode 340 and the second drain electrode 350 may be formed simultaneously.

The first semiconductor pattern 210, the first gate insulating layer 220, the first gate electrode 230, the first source electrode 240 and the first drain electrode 250 may constitute a first thin film transistor 200. The second semiconductor pattern 310, the second gate insulating layer 320, the second gate electrode 330, the second source electrode 340 and the second drain electrode 350 may constitute a second thin film transistor 300. The first thin film transistor 200, the second thin film transistor 300 and the storage capacitor 400 may constitute a driving circuit. That is, in the method of forming the display apparatus according to the embodiment of the present disclosure, the number of masks required for forming the driving circuit may be reduced. Thus, in the method of forming the display apparatus according to the embodiment of the present disclosure, the process efficiency may be improved.

In the method of forming the display apparatus according to the embodiment of the present disclosure, data lines for applying a data signal to each pixel area PA and power voltage supply lines for applying a power voltage to each pixel area PA may be formed simultaneously with the first source electrode 240, the first drain electrode 250, the second source electrode 340 and the second drain electrode 350. For example, the data lines and the power voltage supply lines may be formed on the upper interlayer insulating layer 140. That is, in the method of forming the display apparatus according to the embodiment of the present disclosure, at least one or each of the first capacitor electrode 410 and the second capacitor electrode 420 of the storage capacitor 400 may be formed on a layer different from the scan lines, the data lines, and the power voltage supply lines. Thus, in the method of forming the display apparatus according to the embodiment of the present disclosure, the limitation in the size of the first capacitor electrode 410 and the second capacitor electrode 420 due to the scan lines, the data lines and the power voltage supply lines may be relaxed. Therefore, in the method of forming the display apparatus according to the embodiment of the present disclosure, the area of the storage capacitor 400 may be increased.

Figure 3H:
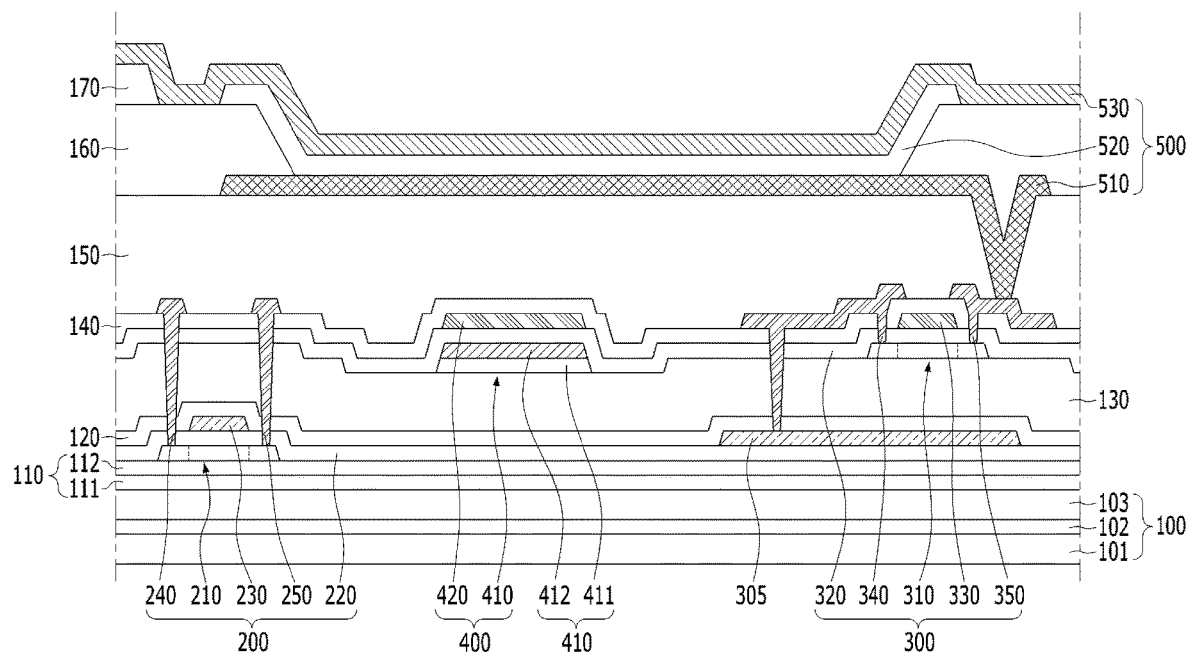

As shown in FIG. 3H, the method of forming the display apparatus according to the embodiment of the present disclosure may include a step of forming an over-coat layer 150 on the driving circuit, and a step of forming a light-emitting device 500, a bank insulating layer 160 and a spacer 170 on the over-coat layer 150.

The over-coat layer 150 may be formed of an insulating material. The over-coat layer 150 may be formed of a material different from the upper interlayer insulating layer 140. For example, the over-coat layer 150 may be formed of an organic insulating material. A thickness difference due to the driving circuit may be removed by the over-coat layer 150.

The light-emitting device 500 may have a stacked structure of a first electrode 510, a light-emitting layer 520 and a second electrode 530. The first electrode 510 and the second electrode 530 may be formed of a conductive material. The second electrode 530 may be formed of a material different from the first electrode 510. For example, the second electrode 530 may be formed to have a transmittance higher than the first electrode 510. The light-emitting layer 520 may include an emission material. The light-emitting layer 520 may have a multi-layer structure.

The bank insulating layer 160 and the spacer 170 may be formed of an insulating material. For example, the bank insulating layer 160 and the spacer 170 may be formed of an organic insulating material. The bank insulating layer 160 and the spacer 170 may be formed of a material different from the over-coat layer 150. The spacer 170 may be formed of the same material as the bank insulating layer 160. For example, the bank insulating layer 160 and the spacer 170 may be formed simultaneously by a half-tone mask.

An edge of the first electrode 510 may be covered by the bank insulating layer 160. An end of the light-emitting layer 520 may be disposed on the bank insulating layer 160. For example, the light-emitting layer 520 may be formed using a fine metal mask (FMM). The end of the light-emitting layer 520 may be spaced away from the spacer 170. For example, the step of forming the light-emitting device 500, the bank insulating layer 160 and the spacer 170 may include a step of forming the first electrode 510 on the over-coat layer 150, a step of forming the bank insulating layer 160 covering the edge of the first electrode 510, a step of forming the spacer 170 on the bank insulating layer 160, a step of locating the fine metal mask having an opening overlapping with a portion of the first electrode 510 exposed by the bank insulating layer 160 on the spacer 170, a step of forming the light-emitting layer 520 using the fine metal mask, a step of removing the fine metal mask, and a step of forming the second electrode 530 on the light-emitting layer 520. Thus, in the method of forming the display apparatus according to the embodiment of the present disclosure, the damage of the bank insulating layer 160 and the light-emitting layer 520 due to the fine metal mask may be prevented.

As shown in FIG. 2, the method of forming the display apparatus according to the embodiment of the present disclosure may include a step of forming an encapsulating element 600 on the second electrode 530 of the light-emitting device 500.

The encapsulating element 600 may have a multi-layer structure. For example, the step of forming the encapsulating element 600 may include a step of forming a first encapsulating layer 610 on the second electrode 530, a step of forming a second encapsulating layer 620 on the first encapsulating layer 610, and a step of forming a third encapsulating layer 630 on the second encapsulating layer 620. The first encapsulating layer 610, the second encapsulating layer 620 and the third encapsulating layer 630 may be formed of an insulating material. The second encapsulating layer 620 may be formed of a material different from the first encapsulating layer 610 and the third encapsulating layer 630. For example, the first encapsulating layer 610 and the third encapsulating layer 630 may be formed of an inorganic insulating material, and the second encapsulating layer 620 may be formed of an organic insulating material.

Accordingly, in the display apparatus according to the embodiment of the present disclosure, the storage capacitor 400 of each pixel area PA may include the first capacitor electrode 410 and the second capacitor electrode 420, which are sequentially stacked on the separation insulating layer 130 covering the first gate electrode 230 of the corresponding pixel area PA, wherein the first capacitor electrode 410 may have a stacked structure of the first electrode layer 411 being formed simultaneously with the second semiconductor pattern 310 by the half-tone mask, and the second electrode layer 412 on the first electrode layer 411, and wherein the second capacitor electrode 420 may be formed simultaneously with the second gate electrode 330 of the corresponding pixel area PA. Thus, in the display apparatus according to the embodiment of the present disclosure, the first capacitor electrode 410 and the second capacitor electrode 420 of the storage capacitor 400 may be formed on a layer different from signal lines for applying various signal to realize an image to each pixel area PA, such as the scan lines, the data lines and the power voltage supply lines. Therefore, in the display apparatus according to the embodiment of the present disclosure, the deterioration of the process efficiency may be reduced or minimized, the voltage stored in the storage capacitor 400 of each pixel area PA may be stably maintained. And, in the display apparatus according to the embodiment of the present disclosure, the storage capacitor 400 of each pixel area PA may be disposed close to the second thin film transistor 300 of the corresponding pixel area PA, which serves as a driving thin film transistor. That is, in the display apparatus according to the embodiment of the present disclosure, the quality of the realized image may be improved.

The display apparatus according to the embodiment of the present disclosure is described that the driving parts SD, DD and TC are disposed outside the display panel DP. However, in the display apparatus according to another embodiment of the present disclosure, at least one of the driving parts SD, DD and TC may be disposed on the display panel DP. For example, the display apparatus according to the embodiment of the present disclosure may be a gate in panel (GIP) type display apparatus in which the scan driver SD is mounted on a non-display area of the display panel DP.

Figure 4:
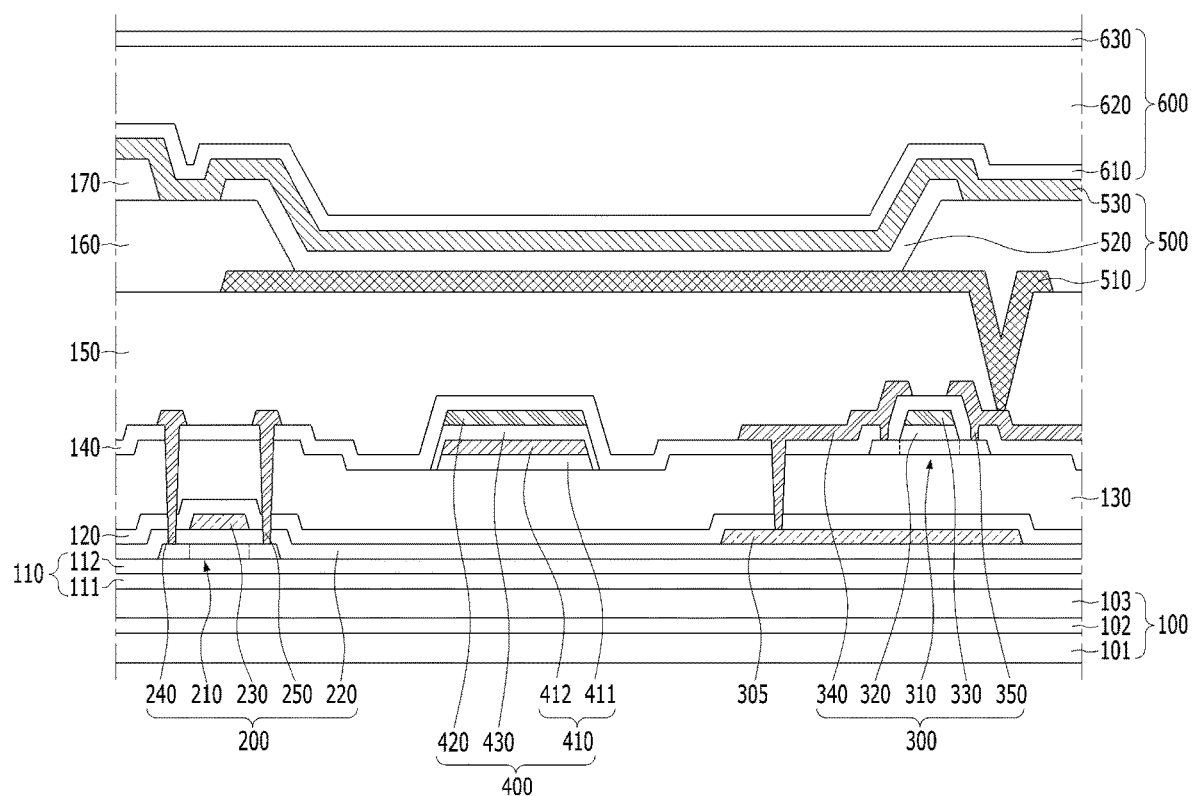
FIG. 4 is a view showing the display apparatus according to another embodiment of the present disclosure.

The display apparatus according to the embodiment of the present disclosure is described that the second gate insulating layer 320 extends between the first capacitor electrode 410 and the second capacitor electrode 420 of the storage capacitor 400. However, in the display apparatus according to another embodiment of the present disclosure, the second gate insulating layer 320 may be disposed only between the second channel region of the second semiconductor pattern 310 and the second gate electrode 330, and the storage capacitor 400 may include a capacitor insulating layer 430 between the second electrode layer 412 of the first capacitor electrode 410 and the second capacitor electrode 420, as shown in FIG. 4. The capacitor insulating layer 430 may be spaced away from the second gate insulating layer 320. The capacitor insulating layer 430 may include an insulating material. For example, the capacitor insulating layer 430 may include an inorganic insulating material, such as silicon oxide (SiO). The capacitor insulating layer 430 may include the same material as the second gate insulating layer 320. For example, a step of the second gate insulating layer 320 and the capacitor insulating layer 430 may include a step of forming an insulating material layer covering the second semiconductor pattern 320 and the first capacitor electrode 410, and a step of patterning the insulating material layer. The capacitor insulating layer 430 may extend onto a side of the first capacitor electrode 410. For example, a side of the first electrode layer 411 and a side of the second electrode layer 412 may be covered by the capacitor insulating layer 430.

The display apparatus according to the embodiment of the present disclosure is described that the second source region, the second channel region and the second drain region of the second semiconductor pattern 310 are formed by the doping process of the conductive impurities. However, in the display apparatus according to another embodiment of the present disclosure, the second source region, the second channel region and the second drain region of the second semiconductor pattern 310 may be formed by various methods. For example, in the display apparatus according to another embodiment of the present disclosure, the second source region, the second channel region and the second drain region may be formed in the second semiconductor pattern by a patterning process of the second gate insulating layer 320.

Figure 5A:
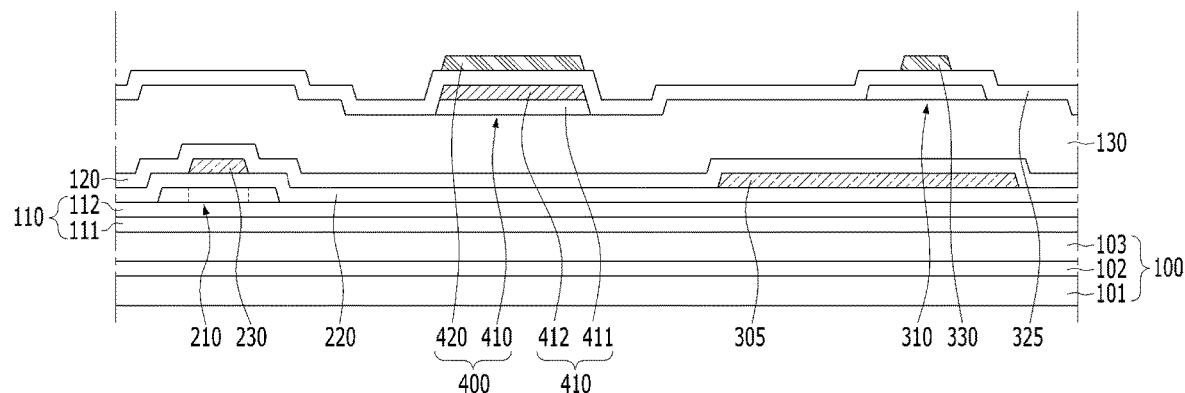
FIGS. 5A and 5B are views sequentially showing a method of forming the display apparatus according to another embodiment of the present disclosure.
Figure 5B:
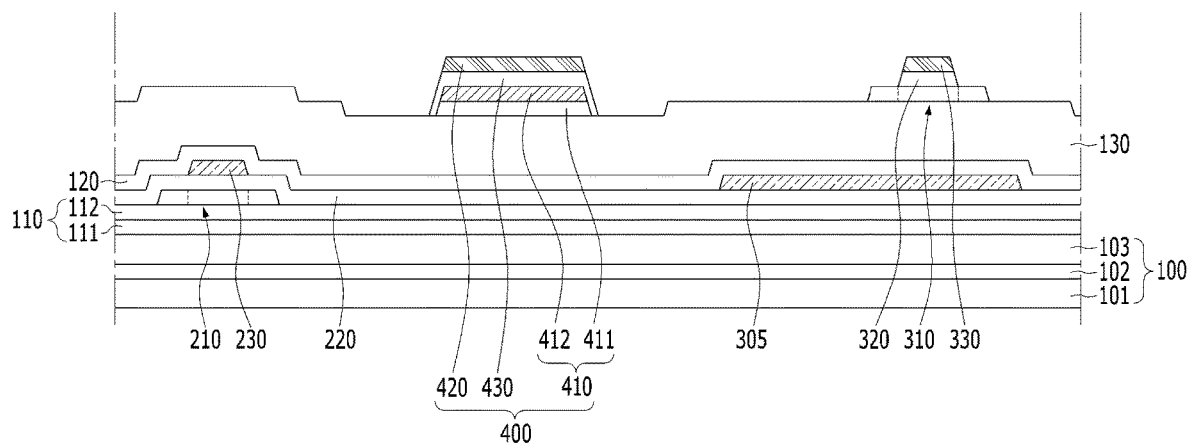

FIGS. 5A and 5B are views sequentially showing a method of forming the display apparatus according to another embodiment of the present disclosure.

The method of forming the display apparatus according to another embodiment of the present disclosure will be described with reference to FIGS. 4, 5A and 5B. First, as shown in FIG. 5A, the method of forming the display apparatus according to another embodiment of the present disclosure may include a step of forming an intermediate insulating layer 325 on a device substrate 100 in which a buffer insulating layer 110, a first semiconductor pattern 210, a first gate insulating layer 220, a first gate electrode 230, a light-blocking pattern 305, a lower interlayer insulating layer 120, a separation insulating layer 130, a first capacitor electrode 410 and a second semiconductor pattern 310 are formed, and a step of forming a second capacitor electrode overlapping with the first capacitor electrode 410 and a second gate electrode 330 overlapping with a central region of the second semiconductor pattern 310 on the intermediate insulating layer 325.

The intermediate insulating layer 325 may be formed of an insulating material. For example, the intermediate insulating layer 325 may be formed of an inorganic insulating material, such as silicon oxide (SiO).

As shown in FIG. 5B, the method of forming the display apparatus according to another embodiment of the present disclosure may include a step of forming a second gate insulating layer 320 between the central region of the second semiconductor pattern 310 and the second gate electrode 330, and a step of forming a capacitor insulating layer 430 between the first capacitor electrode 410 and the second capacitor electrode 420.

The capacitor insulating layer 430 may be formed of the same material as the second gate insulating layer 320. The second gate insulating layer 320 and the capacitor insulating layer 430 may be formed using the intermediate insulating layer 325. For example, the step of forming the second gate insulating layer 320 and the capacitor insulating layer 430 may include a step of patterning the intermediate insulating layer 325 using the second gate electrode 330 and the second capacitor electrode 420 as mask. A side of the capacitor insulating layer 430 may be continuously with a side of the second capacitor electrode 420. For example, a side of the first capacitor electrode 410 may be covered by the capacitor insulating layer 430. The side of the capacitor insulating layer 430 may be vertically aligned with the side of the second capacitor electrode 420. A side of the second gate insulating layer 320 may be continuously with a side of the second gate electrode 330. For example, the second gate insulating layer 320 may expose both ends of the second semiconductor pattern 310. The side of the second gate insulating layer 320 may be vertically aligned with the side of the second gate electrode 330.

In the method of forming the display apparatus according to another embodiment of the present disclosure, the both ends of the second semiconductor pattern 310 exposed by the second gate insulating layer 320 may be conductorized by an etchant used in a pattering process of the intermediate insulating layer 325. In general, a conductorized region of an oxide semiconductor may have a relatively low resistance. That is, in the method of forming the display apparatus according to another embodiment of the present disclosure, the both ends of the second semiconductor pattern 310 may be conductorized by the patterning process of the second gate insulating layer 320 to form the second source region and the second drain region of the second semiconductor pattern 310. Thus, in the method of forming the display apparatus according to another embodiment of the present disclosure, the second source region and the second drain region of the second semiconductor pattern 310 may include a conductorized region of an oxide semiconductor, respectively. The second channel region of the second semiconductor pattern 310 may include a region of an oxide semiconductor which is not conductorized due to the second gate insulating layer 320.

As shown in FIG. 4, the method of forming the display apparatus according to another embodiment of the present disclosure may include a step of forming a first source electrode 240, a first drain electrode 250, a second source electrode 340, a second drain electrode 350, an over-coat layer 150, a light-emitting device 500, a bank insulating layer 160, a spacer 170 and an encapsulating element 600 on an upper interlayer insulating layer 140 which covers a storage capacitor 400 having a stacked structure of the first capacitor electrode 410 and the second capacitor electrode 420, the second semiconductor pattern 310, the second gate insulating layer 320 and the second gate electrode 330.

Accordingly, in the method of forming the display apparatus according to another embodiment of the present disclosure, the second source region, the second channel region and the second drain region may be formed in the second semiconductor pattern 310, without the doping process of the conductivity impurities. Thus, in the method of forming the display apparatus according to another embodiment of the present disclosure, a freedom degree for a process of forming the second channel region and the second drain region in the second semiconductor pattern 310 may be improved. Therefore, in the method of forming the display apparatus according to another embodiment of the present disclosure, the process efficiency may be effectively improved.

Figure 6:
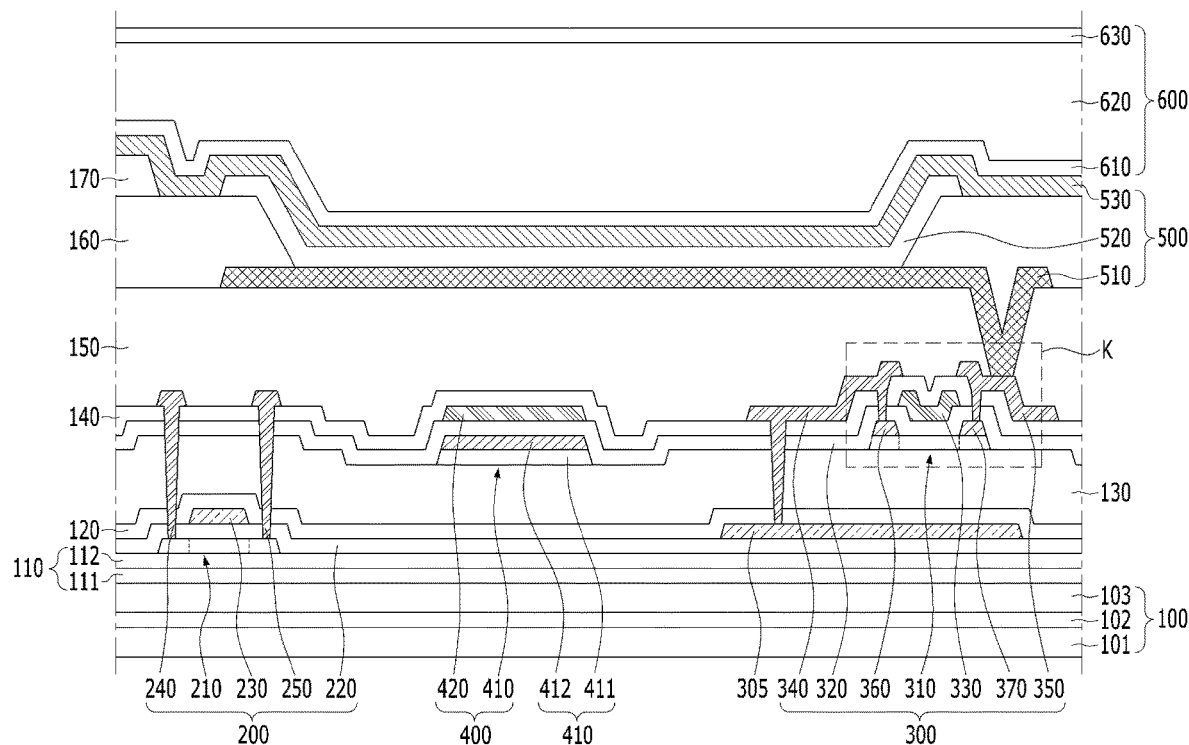
FIG. 6 is a view showing the display apparatus according to another embodiment of the present disclosure.
Figure 7:
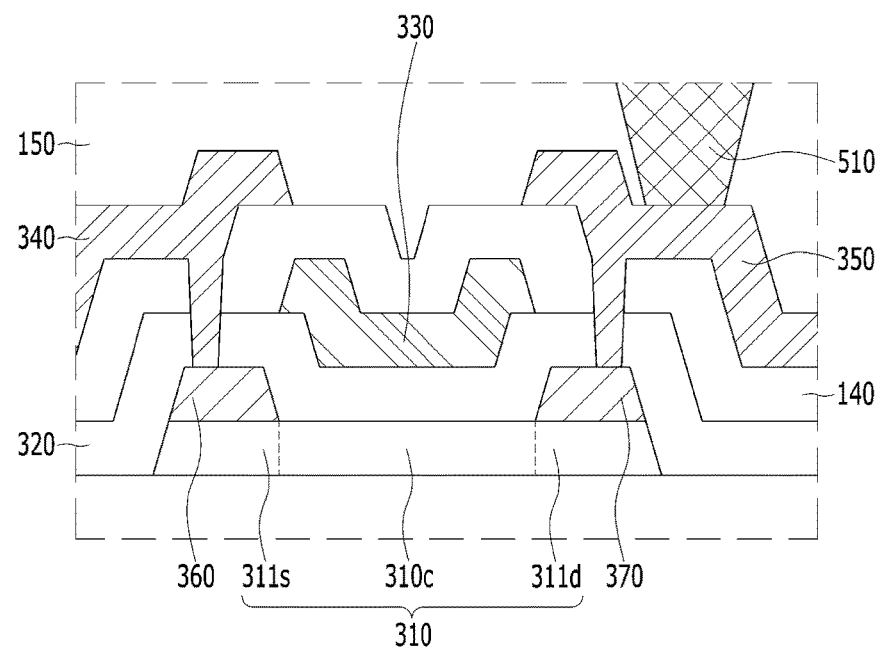
FIG. 7 is an enlarged view of K region in FIG. 6 according to an embodiment of the present disclosure.

The display apparatus according to the embodiment of the present disclosure is described that the second source electrode 340 is in direct contact with the second source region of the second semiconductor pattern 310, and the second drain electrode 350 is in direct contact with the second drain region of the second semiconductor pattern 310. However, in the display apparatus according to another embodiment of the present disclosure, the second thin film transistor 300 may further include a source connecting pattern 360 between the second source region of the second semiconductor pattern 310 and the second source electrode 340, and a drain connecting pattern 370 between the second drain region of the second semiconductor pattern 310 and the second drain electrode 350, as shown in FIGS. 6 and 7. The source connecting pattern 360 may be in direct contact with the second source region of the second semiconductor pattern 310 and the second source electrode 340. For example, the second source electrode 340 may be electrically connected to the second source region of the second semiconductor pattern 310 through the source connecting pattern 360. The drain connecting pattern 370 may be in direct contact with the second drain region of the second semiconductor pattern 310 and the second drain electrode 350. For example, the second drain electrode 350 may be electrically connected to the second drain region of the second semiconductor pattern 310 through the drain connecting pattern 370. The source connecting pattern 360 and the drain connecting pattern 370 may be disposed outside the second channel region of the second semiconductor pattern 310. For example, the second channel region of the second semiconductor pattern 310 may be disposed between the source connecting pattern 360 and the drain connecting pattern 370.

The source connecting pattern 360 and the drain connecting pattern 370 may include a conductive material. For example, the source connecting pattern 360 and the drain connecting pattern 370 may include a metal, such as aluminum (Al), titanium (Ti), copper (Cu), chrome (Cr), molybdenum (Mo) and tungsten (W). The drain connecting pattern 370 may include the same material as the source connecting pattern 360. For example, the drain connecting pattern 370 may be formed simultaneously with the source connecting pattern 360. The source connecting pattern 360 and the drain connecting pattern 370 may be covered by the second gate insulating layer 320. For example, the source connecting pattern 360 and the drain connecting pattern 370 may be disposed on the same layer as the second electrode layer 412 of the first capacitor electrode 410. The source connecting pattern 360 and the drain connecting pattern 370 may include the same material as the second electrode layer 412 of the first capacitor electrode 410.

Figure 8A:
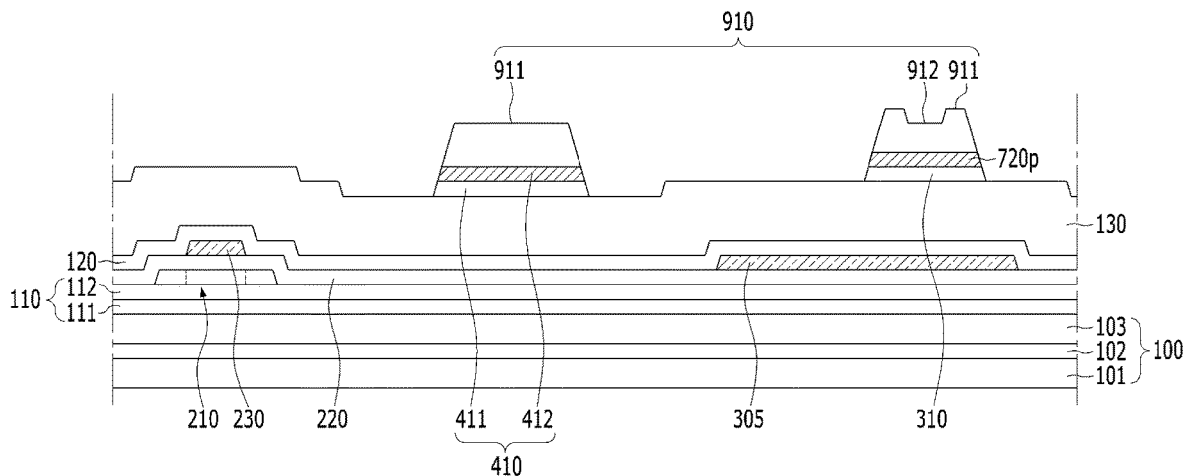
FIGS. 8A to 8C are views sequentially showing a method of forming the display apparatus according to further another embodiment of the present disclosure.
Figure 8B:
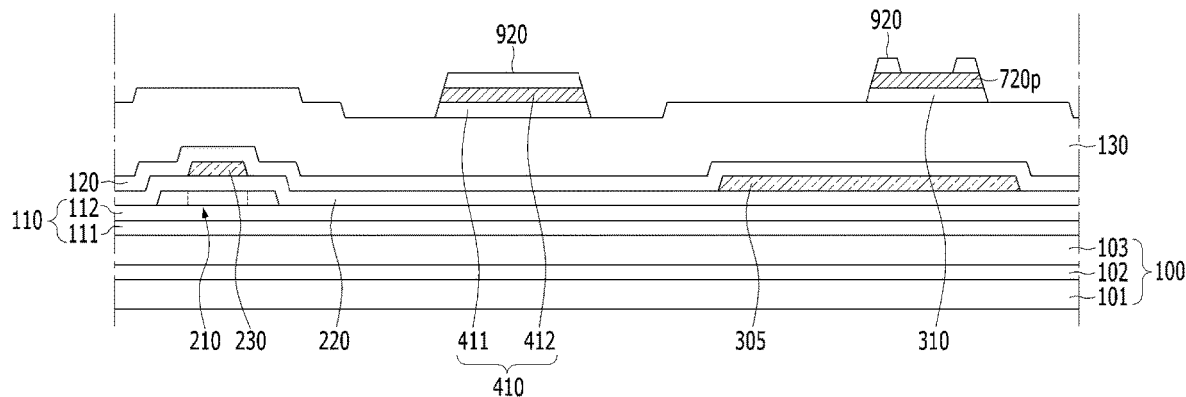
Figure 8C:
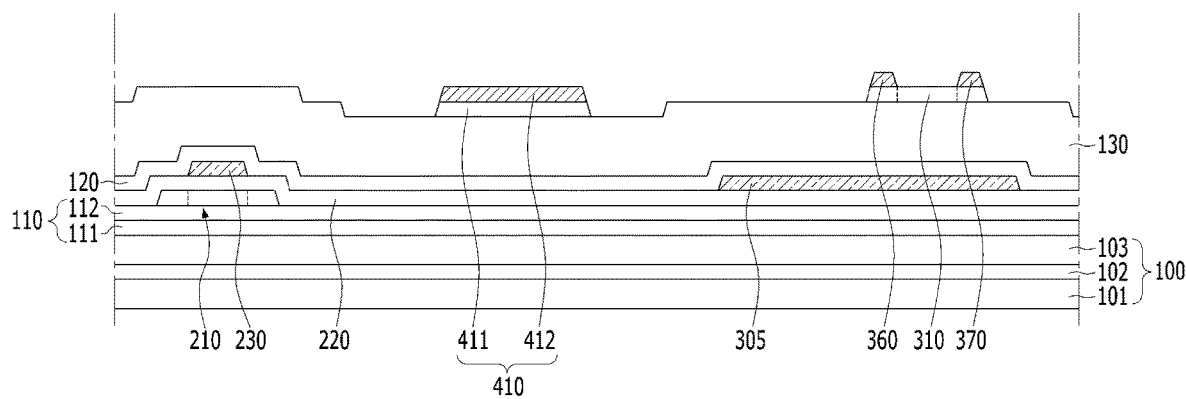

FIGS. 8A to 8C are views sequentially showing a method of forming the display apparatus according to another embodiment of the present disclosure.

The method of forming the display apparatus according to another embodiment of the present disclosure will be described with reference to FIGS. 6, 7 and 8A to 8C. First, as shown in FIG. 8A, the method of forming the display apparatus according to another embodiment of the present disclosure may include a step of stacking a semiconductor material layer and an electrode material layer on a device substrate 100 in which a buffer insulating layer 110, a first semiconductor pattern 210, a first gate insulating layer 220, a first gate electrode 230, a light-blocking pattern 305, a lower interlayer insulating layer 120, a step of forming a first mask pattern 910 including a first pattern portion 911 and a second pattern portion 912 having a thinner thickness than the first pattern portion 911 on the electrode material layer, and a step of forming a first capacitor electrode 410, a second semiconductor pattern 310 and a dummy pattern 720*p* using the first mask pattern 910.

The step of forming the first capacitor electrode 410, the second semiconductor pattern 310 and the dummy pattern 720*p* may include a step of patterning the semiconductor material layer and the electrode material layer using the first mask pattern 910. The first pattern portion 911 may be disposed on the first capacitor electrode 410 and a region where a source connecting pattern and a drain connecting pattern are to be formed by a subsequent process. For example, the first pattern portion 911 may include a region overlapping with both ends of the second semiconductor pattern 310. The second pattern portion 912 may overlap a central region of the second semiconductor pattern 310.

As shown in FIG. 8B, the method of forming the display apparatus according to another embodiment of the present disclosure may include a step of forming a second mask pattern 920 by a cleaning process of the first mask pattern 910.

The second mask pattern 920 may expose the central region of the dummy pattern 720*p*. For example, the step of forming the second mask pattern 920 may include a step of completely removing the second pattern portion 912 of the first mask pattern 910 by the cleaning process. The second mask pattern 920 may be a first pattern portion 911 which is a remained region after the cleaning process.

As shown in FIG. 8C, the method of forming the display apparatus according to another embodiment of the present disclosure may include a step of forming the source connecting pattern 360 and the drain connecting pattern 370 using the second mask pattern 920, and a step of removing the second mask pattern 920.

The step of forming the source connecting pattern 360 and the drain connecting pattern 370 may include a step of patterning the dummy pattern 720*p* using the second mask pattern 920. For example, the step of removing the second mask pattern 920 may be performed after the source connecting pattern 360 and the drain connecting pattern 370 are formed.

A region of the second semiconductor pattern 310 overlapping with the source connecting pattern 360 may be defined as a second source region. A region of the second semiconductor pattern 310 overlapping with the drain connecting pattern 370 may be defined as a second drain region. For example, the second source region and the second drain region of the second semiconductor pattern 310 may have the same resistance as the second channel region of the second semiconductor pattern 310. Thus, in the method of forming the display apparatus according to another embodiment of the present disclosure, a process of forming the second source region, the second channel region and the second drain region in the second semiconductor pattern 310 may be omitted. Therefore, in the method of forming the display apparatus according to another embodiment of the present disclosure, the process efficiency may be improved.

As shown in FIGS. 6 and 7, the method of forming the display apparatus according to another embodiment of the present disclosure may include a step of forming a second capacitor electrode 420, a second gate electrode 330, an upper interlayer insulating layer 140, a first source electrode 240, a first drain electrode 250, a second source electrode 340, a second drain electrode 350, an over-coat layer 150, a light-emitting device 500, a bank insulating layer 160, a spacer 170 and an encapsulating element 600 on the second gate insulating layer 320 which covers the first capacitor electrode 410, the second semiconductor pattern 310, the source connecting pattern 360 and the drain connecting pattern 370.

Accordingly, in the display apparatus according to another embodiment of the present disclosure, the source connecting pattern 360 defining the second source region of the second semiconductor pattern 310 and the drain connecting pattern 370 defining the second drain region of the second semiconductor pattern 310 may be formed using the forming process of the first capacitor electrode 410. Thus, in the display apparatus according to another embodiment of the present disclosure, the voltage stored in the storage capacitor 400 of each pixel area PA may be stably maintained, and a freedom degree for a process of forming the second source region, the second channel region and the second drain region in the second semiconductor pattern 310 may be improved. Therefore, in the display apparatus according to another embodiment of the present disclosure, the deterioration of the process efficiency may be reduced or minimized, and the quality of the realized image may be improved.

Figure 9:
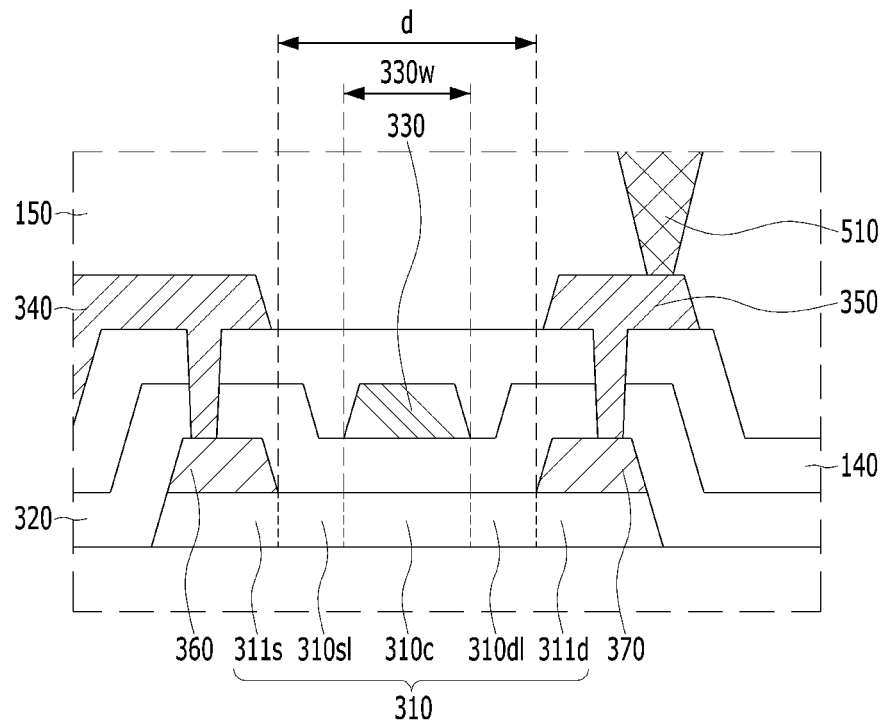
FIGS. 9 to 11 are views showing the display apparatus according to other embodiments of the present disclosure, respectively.

In the display apparatus according to another embodiment of the present disclosure, a horizontal width 330*w* of the second gate electrode 330 may be smaller than a distance d between the second source region and the second drain region of the second semiconductor pattern 310, as shown in FIG. 9. For example, in the display apparatus according to another embodiment of the present disclosure, the second semiconductor pattern 310 may include a source low-resistance region 310*s*1 between the second source region 311*s* and the second channel region 310*c*, and a drain low-resistance region 310*d*1 between the second channel region 310*c* and the second drain region 311*d*. The source low-resistance region 310*s*1 and the drain low-resistance region 310*d*1 may have a resistance lower than the second channel region 310*c*, respectively. For example, the source low-resistance region 310*s*1 and the drain low-resistance region 310*d*1 may be formed by a doping process of conductive impurities. The source low-resistance region 310*s*1 may be formed between the source connecting pattern 360 and the second gate electrode 330. The drain low-resistance region 310*d*1 may be formed between the second gate electrode 330 and the drain connecting pattern 370. For example, the source low-resistance region 310*s*1 and the drain low-resistance region 310*d*1 may be formed by a process of doping the conductive impurities into a region of the second semiconductor pattern 310 exposed by the second gate electrode 330, the source connecting pattern 360 and the drain connecting pattern 370. Thus, in the display apparatus according to another embodiment of the present disclosure, the operation of the second thin film transistor 300 serving as the driving thin film transistor in each pixel area PA may be stably maintained.

Figure 10:
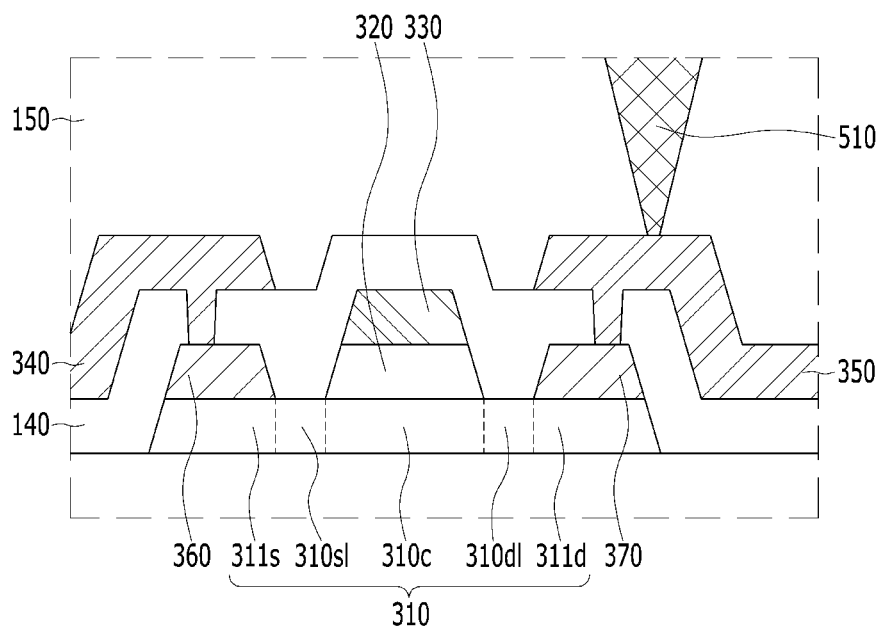

In the display apparatus according to another embodiment of the present disclosure, the second gate insulating layer 320 may be disposed between the source connecting pattern 360 and eh drain connecting pattern 370, as shown in FIG. 10. The source low-resistance region 310*s*1 may be formed between the source connecting pattern 360 and the second gate insulating layer 320. The drain low-resistance region 310d1 may be formed between the second gate insulating layer 320 and the drain connecting pattern 370. For example, the sourced low-resistance region 310s1 and the drain low-resistance region 310d1 may be formed by a patterning process of the second gate insulating layer 320. The sourced low-resistance region 310s1 and the drain low-resistance region 310d1 may include a conductorized region of an oxide semiconductor, respectively. For example, a step of forming the sourced low-resistance region 310s1 and the drain low-resistance region 310d1 may include a step of forming the second gate electrode 330 on the second gate insulating layer 320 covering the source connecting pattern 360 and the drain connecting pattern 370, and a step of patterning the second gate insulating layer 320 using the second gate electrode 330 as mask. The second source region 311s and the second drain region 311d of the second semiconductor pattern 310 may be not exposed to etchant used in the patterning process of the second gate insulating layer 320 by the source connecting pattern 360 and the drain connecting pattern 370. For example, the second source region 311s, the second channel region 310c and the second drain region 311d of the second semiconductor pattern 310 may be made of an oxide semiconductor which is not conductorized. Thus, in the display apparatus according to another embodiment of the present disclosure, the deterioration of the process efficiency may be reduced or minimized, and the quality of the realized image may be effectively improved.

Figure 11:
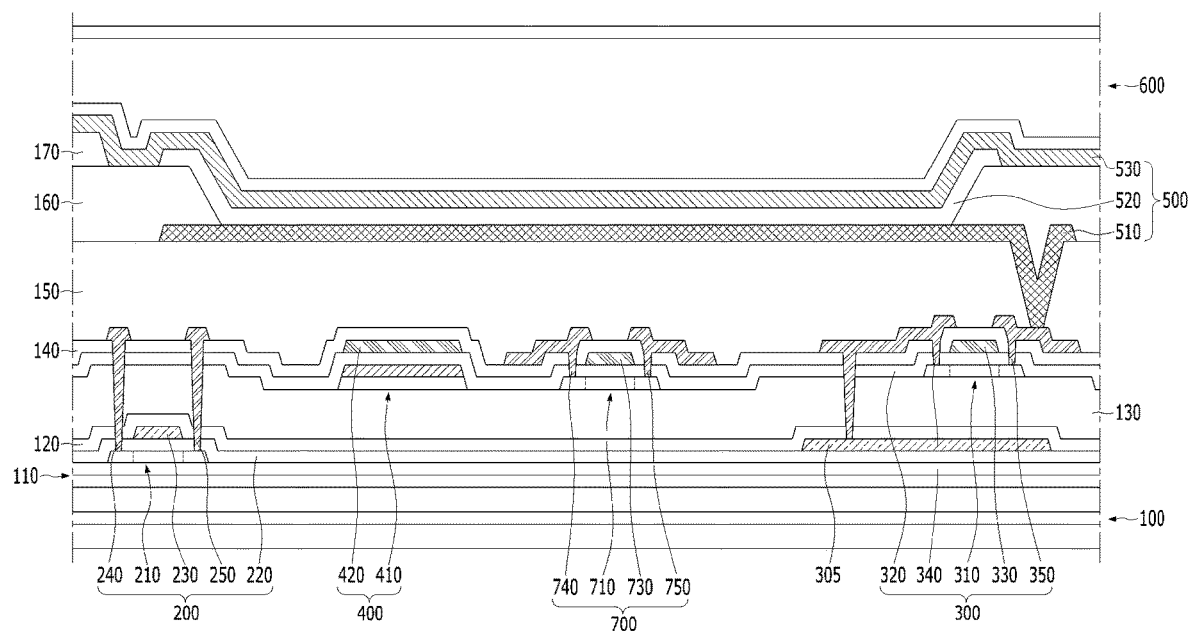

The display apparatus according to the embodiment of the present disclosure is described that the driving circuit of each pixel area PA is constituted by the first thin film transistor 200, the second thin film transistor 300 and the storage capacitor 400. However, in the display apparatus according to another embodiment of the present disclosure, the driving circuit of each pixel area PA may include three or more thin film transistor. For example, in the display apparatus according to another embodiment of the present disclosure, the driving circuit of each pixel area PA may further include a third thin film transistor 700 being spaced away from a first thin film transistor 200, a second thin film transistor 300 and a storage capacitor 400, as shown in FIG. 11. The third thin film transistor 700 may have the same structure as the first thin film transistor 200 and the second thin film transistor 300. For example, the third thin film transistor 700 may include a third semiconductor pattern 710, a third gate electrode 730, a third source electrode 740 and a third drain electrode 750.

The third thin film transistor 700 may be disposed on the separation insulating layer 130. For example, the third semiconductor pattern 710 may be disposed on the same layer as a second semiconductor pattern 310 of the second thin film transistor 300. The third semiconductor pattern 710 may include the same material as the second semiconductor pattern 310. For example, the third semiconductor pattern 710 may include an oxide semiconductor, such as IGZO. The third semiconductor pattern 710 may be formed simultaneously with the second semiconductor pattern 310.

The third semiconductor pattern 710 may include a third source region, a third channel region and a third drain region. The third channel region may be disposed between the third source region and the third drain region. The third source region and the third drain region may have a resistance lower than the third channel region. For example, the third channel region of the third semiconductor pattern 710 may have the same resistance as a second channel region of the second semiconductor pattern 310, and the third source region and the third drain region of the third semiconductor pattern 710 may have the same resistance as a second source region and a second drain region of the second semiconductor pattern 310.

The third gate electrode 730 may include a conductive material. For example, the third gate electrode 730 may include a metal, such as aluminum (Al), titanium (Ti), copper (Cu), chrome (Cr), molybdenum (Mo) and tungsten (W). The third gate electrode 730 may be insulated from the third semiconductor pattern 710. For example, a second gate insulating layer 320 of the second thin film transistor 300 may extend between the third semiconductor pattern 710 and the third gate electrode 730. The third gate electrode 730 may include the same material as a second gate electrode 330 of the second thin film transistor 300. The third gate electrode 730 may overlap the third channel region of the third semiconductor pattern 710. For example, the third channel region of the third semiconductor pattern 710 may have an electrical conductivity corresponding to a voltage applied to the third gate electrode 730.

The third source electrode 740 and the third drain electrode 750 may include a conductive material. For example, the third source electrode 740 and the third drain electrode 750 may include a metal, such as aluminum (Al), titanium (Ti), copper (Cu), chrome (Cr), molybdenum (Mo) and tungsten (W). The third drain electrode 750 may include the same material as the third source electrode 740. For example, the third drain electrode 750 may be disposed on the same layer as the third source electrode 740. The third source electrode 740 and the third drain electrode 750 may include a material different from the third gate electrode 730. The third source electrode 740 and the third drain electrode 750 may be disposed on a layer different from the third gate electrode 730. For example, an upper interlayer insulating layer 140 covering the second gate electrode 330 may extend between the third gate electrode 730 and the third source electrode 740, and between the third gate electrode 730 and the third drain electrode 750. The third source electrode 740 and the third drain electrode 750 may be insulated from the third gate electrode 730 by the upper interlayer insulating layer 140. The third source electrode 740 and the third drain electrode 750 may include the same material as a second source electrode 340 and a second drain electrode 350 of the second thin film transistor 300. The third source electrode 740 and the third drain electrode 750 may be disposed the same layer as the second source electrode 340 and the second drain electrode 350. For example, the third source electrode 740 and the third drain electrode 750 may be formed simultaneously with the second source electrode 340 and the second drain electrode 350.

The third source electrode 740 may be electrically connected to the third source region of the third semiconductor pattern 710. The third drain electrode 750 may be electrically connected to the third drain region of the third semiconductor pattern 710. For example, the second gate insulating layer 320 and the upper interlayer insulating layer 140 may include a third source contact hole partially exposing the third source region of the third semiconductor pattern 710, and a third drain contact hole partially exposing the third drain region of the third semiconductor pattern 710. The third source electrode 740 may be in direct contact with the third source region of the third semiconductor pattern 710 through the third source contact hole. The third drain electrode 750 may be in direct contact with the third drain region of the third semiconductor pattern 710 through the third drain contact hole.

The third thin film transistor 700 may transmit a specific signal by turned on according to a voltage applied to the third gate electrode 730. For example, the third thin film transistor 700 may serve as a switching thin film transistor to apply a reset voltage to a first capacitor electrode 410 or a second capacitor electrode 420 of the storage capacitor 400 according to a scan signal. That is, in the display apparatus according to another embodiment of the present disclosure, the second thin film transistor 300 serving as a driving thin film transistor and the third thin film transistor 700 serving as a switching thin film transistor may be formed on the separation insulating layer 130 by the same process. Thus, in the display apparatus according to another embodiment of the present disclosure, the resolution degradation due to an increase in the number of thin film transistors 200, 300 and 700 which constitute each driving circuit may be reduced or minimized. And, in the display apparatus according to another embodiment of the present disclosure, the thin film transistors 200, 300 and 700 constituting the each driving circuit may be connected by wires, which are disposed on the same layer as a first gate electrode 230 of the first thin film transistor 200 and/or a first source electrode 240 and a first drain electrode 250 of the first thin film transistor 200. Therefore, in the display apparatus according to another embodiment of the present disclosure, the voltage stored in the storage capacitor 400 of each driving circuit may be stably maintained, regardless of the number of thin film transistors 200, 300 and 700 constituting each driving circuit.

In the result, the display apparatus according to the embodiments of the present disclosure may include the light-emitting device and the driving circuit in each pixel area, wherein the driving circuit may include the first thin film transistor, the second thin film transistor and the storage capacitor, wherein the second thin film transistor may include the second semiconductor pattern disposed on a layer different from the first semiconductor pattern of the first thin film transistor, wherein the storage capacitor may include a stacked structure of the first capacitor electrode and the second capacitor electrode, and wherein the first capacitor electrode may have a stacked structure of the first electrode layer including the same material as the second semiconductor pattern and the second electrode layer including a material having a resistance lower than the first electrode layer. Thus, in the display apparatus according to the embodiments of the present disclosure, the distortion of the voltage stored in the storage capacitor of each pixel area due to the signal lines may be prevented. And, in the display apparatus according to the embodiments of the present disclosure, the area of the storage capacitor in each pixel area may be increased, without significant change in process efficiency. Thereby, in the display apparatus according to the embodiments of the present disclosure, the degradation of process efficiency may be reduced or minimized, and the quality of the image may be improved.

What is claimed is:

1. A display apparatus comprising:
   a separation insulating layer on a device substrate;
   a first thin film transistor on the device substrate, the first thin film transistor including a first semiconductor pattern between the device substrate and the separation insulating layer;
   a second thin film transistor on the separation insulating layer, the second thin film transistor including a second semiconductor pattern being made of a different material from the first semiconductor pattern;
   a storage capacitor including a first capacitor electrode and a second capacitor electrode, which are sequentially stacked on the separation insulating layer;
   an over-coat layer on the first thin film transistor, the second thin film transistor, and the storage capacitor; and
   a light-emitting device on the over-coat layer, the light-emitting device being electrically connected to the second thin film transistor,
   wherein the first capacitor electrode has a stacked structure of a first electrode layer including the same material as the second semiconductor pattern and a second electrode layer including a material having a lower resistance than the first electrode layer.

2. The display apparatus of claim 1, wherein the first semiconductor pattern includes polycrystalline silicon, and the second semiconductor pattern includes oxide semiconductor.

3. The display apparatus of claim 1, further comprising a third thin film transistor being spaced away from the second thin film transistor and the storage capacitor,
   wherein the third thin film transistor includes a third semiconductor pattern disposed on the same layer as the second semiconductor pattern.

4. The display apparatus of claim 3, wherein the third semiconductor pattern includes oxide semiconductor.

5. The display apparatus of claim 1, wherein the second electrode layer is in contact with an upper surface of the first electrode layer.

6. The display apparatus of claim 5, wherein a side of the first electrode layer is continuous with a side of the second electrode layer.

7. The display apparatus of claim 1, wherein the second capacitor electrode includes the same material as a gate electrode of the second thin film transistor.

8. The display apparatus of claim 7, wherein a gate insulating layer of the second thin film transistor extends between the first capacitor electrode and the second capacitor electrode.

9. A display apparatus comprising:
   a first thin film transistor on the device substrate, the first thin film transistor including a first semiconductor pattern, a first gate insulating layer, a first gate electrode, a first source electrode, and a first drain electrode;
   a second thin film transistor being spaced away from the first thin film transistor, the second thin film transistor including a second semiconductor pattern, a second gate insulating layer, a second gate electrode, a second source electrode and a second drain electrode;
   a storage capacitor being spaced away from the first thin film transistor and the second thin film transistor, the storage capacitor having a stacked structure of a first capacitor electrode, a capacitor insulating layer, and a second capacitor electrode;
   an over-coat layer on the first thin film transistor, the second thin film transistor, and the storage capacitor; and
   a light-emitting device on the over-coat layer, the light-emitting device having a stacked structure of a first electrode, a light-emitting layer, and a second electrode,
   wherein the second semiconductor pattern of the second thin film transistor includes an oxide semiconductor,
   wherein the first capacitor electrode has a stacked structure of a first electrode layer including an oxide semiconductor and a second electrode layer including a material having higher electrical conductivity than the first electrode layer, and wherein the second semiconductor pattern and the first electrode layer are disposed on a layer different from the first semiconductor pattern.

10. The display apparatus of claim 9, further comprising:
a separation insulating layer between the device substrate and the second thin film transistor; and
an upper interlayer insulating layer between the separation insulating layer and the over-coat layer, the upper interlayer insulating layer covering the storage capacitor,
wherein the first semiconductor pattern and the first gate electrode of the first thin film transistor are disposed between the device substrate and the separation insulating layer,
wherein the first source electrode, the first drain electrode, the second source electrode, and the second drain electrode are disposed between the upper interlayer insulating layer and the over-coat layer.

11. The display apparatus of claim 9, wherein the second semiconductor pattern includes a channel region between a source region and a drain region,
wherein the second thin film transistor further includes a source connecting pattern between the source region of the second semiconductor pattern and the second source electrode, and a drain connecting pattern between the drain region of the second semiconductor pattern and the second drain electrode, and
wherein the source connecting pattern and the drain connecting pattern include the same material as the second electrode layer of the first capacitor electrode.

12. The display apparatus of claim 11, wherein the source region and the drain region of the second semiconductor pattern has the same resistance as the channel region of the second semiconductor pattern.

13. The display apparatus of claim 11, wherein the source connecting pattern is in contact with an upper surface of the source region of the second semiconductor pattern opposite to the device substrate,
wherein the drain connecting pattern is in contact with an upper surface of the drain region of the second semiconductor pattern opposite to the device substrate.

14. The display apparatus of claim 13, wherein each of the source connecting pattern and the drain connecting pattern includes a side vertically aligned with a side of the second semiconductor pattern.

15. The display apparatus of claim 13, wherein a horizontal width of the second gate electrode is smaller than a distance between the source region and the drain region of the second semiconductor pattern.

16. The display apparatus of claim 15, wherein the second semiconductor pattern includes a source low-resistance region between the source region and the channel region and a drain low-resistance region between the channel region and the drain region,
wherein the source low-resistance region and the drain low-resistance region of the second semiconductor pattern have a lower resistance than the channel region of the second semiconductor pattern, respectively.

17. The display apparatus of claim 16, wherein the second gate insulating layer, the source connecting pattern and the drain connecting pattern expose the source low-resistance region and the drain low-resistance region of the second semiconductor pattern, and wherein the source low-resistance region and the drain low-resistance region of the second semiconductor pattern are a conductorized region of an oxide semiconductor.

18. A display apparatus comprising:
a first thin film transistor on a device substrate, the first thin film transistor (TFT) including at least a first semiconductor pattern, a first gate electrode, and a first source electrode and a first drain electrode connected to the first semiconductor pattern, wherein at least one of the first source electrode or the first drain electrode is electrically connected to a data line, and wherein the first gate electrode is electrically connected to a scan line;
a second thin film transistor on the device substrate, the second TFT including at least a second semiconductor pattern, a second gate electrode, and a second source electrode and a second drain electrode connected to the second semiconductor pattern, wherein at least one of the second source electrode or the second drain electrode is electrically connected to a voltage supply line and the remaining one of the second source electrode and the drain electrode is electrically connected to a light-emitting device; and
a storage capacitor including a first capacitor electrode and a second capacitor electrode,
wherein at least one of the first capacitor electrode and the second capacitor electrode is disposed on a layer different than one or more layers the data line, the scan line, and the voltage supply line is disposed on, and
the first semiconductor pattern includes polycrystalline silicon, and the second semiconductor pattern includes oxide semiconductor.

19. The display apparatus of claim 18, further comprising:
a separation insulating layer on the first gate electrode of the first TFT, and wherein the at least one of the first capacitor electrode and the second capacitor electrode is disposed on the separation insulating layer.

20. The display apparatus of claim 19, wherein the separation insulating layer is disposed under the second TFT.

21. The display apparatus of claim 18, further comprising:
an interlayer insulating layer on the storage capacitor,
wherein at least a part of the first source electrode, the first drain electrode, the second source electrode, or the second drain electrode are disposed on the interlayer insulating layer, and
wherein the data line and the voltage supply line are disposed on the interlayer insulating layer.

22. The display apparatus of claim 21, further comprising:
a first gate insulating layer, wherein at least the first gate insulating layer is between the first gate electrode and the first semiconductor pattern,
wherein the scan line is disposed on the first gate insulating layer.

23. The display apparatus of claim 18, wherein the first capacitor electrode includes a first electrode layer and a second electrode layer on the first electrode layer, wherein the first electrode layer includes a same material as the second semiconductor pattern.

24. The display apparatus of claim 23, wherein the second TFT further includes:
a source connecting pattern between a source region of the second semiconductor pattern and the second source electrode, a drain connecting pattern between a drain region of the second semiconductor pattern and the second drain electrode, wherein the source connecting pattern and the drain connecting pattern include a same material as the second electrode layer of the second electrode layer.

25. The display apparatus of claim 18, wherein second capacitor electrode of the storage capacitor includes a same material as the second gate electrode.

26. The display apparatus of claim 18, wherein each of the first capacitor electrode and the second capacitor electrode is disposed on layers different from the one or more layers the data line, the scan line, and the voltage supply line are disposed on.

* * * * *